United States Patent
Yamaguchi et al.

(10) Patent No.: US 9,831,083 B2
(45) Date of Patent: Nov. 28, 2017

(54) METHOD OF MANUFACTURING SEMICONDUCTOR DEVICE, SUBSTRATE PROCESSING APPARATUS AND NON-TRANSITORY COMPUTER-READABLE RECORDING MEDIUM

(71) Applicant: HITACHI KOKUSAI ELECTRIC INC., Tokyo (JP)

(72) Inventors: Daigo Yamaguchi, Toyama (JP); Tsukasa Kamakura, Toyama (JP); Hiroshi Ashihara, Toyama (JP); Tsuyoshi Takeda, Toyama (JP); Taketoshi Sato, Toyama (JP)

(73) Assignee: HITACHI KOKUSAI ELECTRIC INC., Tokyo (JP)

( * ) Notice: Subject to any disclaimer, the term of this patent is extended or adjusted under 35 U.S.C. 154(b) by 0 days.

(21) Appl. No.: 15/023,232

(22) PCT Filed: Sep. 27, 2013

(86) PCT No.: PCT/JP2013/076273
§ 371 (c)(1),
(2) Date: Mar. 18, 2016

(87) PCT Pub. No.: WO2015/045099
PCT Pub. Date: Apr. 2, 2015

(65) Prior Publication Data
US 2016/0233085 A1    Aug. 11, 2016

(51) Int. Cl.
*H01L 21/31*  (2006.01)
*H01L 21/469* (2006.01)
(Continued)

(52) U.S. Cl.
CPC ........ *H01L 21/02271* (2013.01); *C23C 16/30* (2013.01); *C23C 16/308* (2013.01);
(Continued)

(58) Field of Classification Search
CPC . H01L 21/02; H01L 21/285; H01L 21/02271; H01L 21/02211;
(Continued)

(56) References Cited

U.S. PATENT DOCUMENTS

2012/0321791 A1* 12/2012 Suzuki ............... C23C 16/36
                                                    427/255.38
2012/0329286 A1  12/2012 Takeda et al.
(Continued)

FOREIGN PATENT DOCUMENTS

JP   2012-142482 A   7/2012
JP   2012-186275 A   9/2012
(Continued)

OTHER PUBLICATIONS

May 19, 2016 Office Action issued in Taiwanese Patent Application No. 103 13278.
(Continued)

*Primary Examiner* — Charles Garber
*Assistant Examiner* — Abdulfattah Mustapha
(74) *Attorney, Agent, or Firm* — Oliff PLC

(57) ABSTRACT

A film containing a prescribed element and carbon is formed on a substrate, by performing a cycle a prescribed number of times, the cycle including: supplying an organic-based source containing a prescribed element and a pseudo catalyst including at least one selected from the group including a halogen compound and a boron compound, into a process chamber in which the substrate is housed, and confining the organic-based source and the pseudo catalyst in the process chamber; maintaining a state in which the organic-based source and the pseudo catalyst are confined in the process chamber; and exhausting an inside of the process chamber.

14 Claims, 13 Drawing Sheets

(51) Int. Cl.
| | |
|---|---|
| *H01L 21/02* | (2006.01) |
| *C23C 16/30* | (2006.01) |
| *C23C 16/32* | (2006.01) |
| *C23C 16/36* | (2006.01) |
| *C23C 16/44* | (2006.01) |
| *C23C 16/455* | (2006.01) |
| *C23C 16/52* | (2006.01) |
| *H01L 21/285* | (2006.01) |
| *H01L 21/768* | (2006.01) |

(52) U.S. Cl.
CPC ............ *C23C 16/325* (2013.01); *C23C 16/36* (2013.01); *C23C 16/44* (2013.01); *C23C 16/4412* (2013.01); *C23C 16/45523* (2013.01); *C23C 16/52* (2013.01); *H01L 21/0217* (2013.01); *H01L 21/02126* (2013.01); *H01L 21/02167* (2013.01); *H01L 21/02172* (2013.01); *H01L 21/02211* (2013.01); *H01L 21/02277* (2013.01); *H01L 21/28556* (2013.01); *H01L 21/28568* (2013.01); *H01L 21/76829* (2013.01)

(58) Field of Classification Search
CPC ......... H01L 21/02126; H01L 21/02167; H01L 21/0217; H01L 21/28556; H01L 21/28568; C23C 16/52; C23C 16/44; C23C 16/4412
See application file for complete search history.

(56) References Cited

U.S. PATENT DOCUMENTS

| | | |
|---|---|---|
| 2013/0102132 A1 | 4/2013 | Takeda |
| 2013/0149872 A1* | 6/2013 | Hirose ................ H01L 21/3185 438/762 |

FOREIGN PATENT DOCUMENTS

| | | |
|---|---|---|
| JP | 2013-021301 A | 1/2013 |
| JP | 2013-030752 A | 2/2013 |
| JP | 2013-102130 A | 5/2013 |
| JP | 2013-191770 A | 9/2013 |
| TW | 201330060 A | 7/2013 |

OTHER PUBLICATIONS

Apr. 7, 2016 International Preliminary Report on Patentability issued in International Patent Application No. PCT/JP2013/076273.
Dec. 17, 2013 International Search Report issued in International Patent Application No. PCT/JP2013/076273.

* cited by examiner

METHOD OF MANUFACTURING SEMICONDUCTOR DEVICE, SUBSTRATE PROCESSING APPARATUS AND NON-TRANSITORY COMPUTER-READABLE RECORDING MEDIUM

FIELD OF THE INVENTION

The present invention relates to a method of manufacturing a semiconductor device, a substrate processing apparatus and a non-transitory computer-readable recording medium.

DESCRIPTION OF THE RELATED ART

As one of steps of manufacturing a semiconductor device, a film formation processing is sometimes performed, which is the processing of forming a carbide-based film containing a prescribed element and carbon on a substrate by performing a cycle a prescribed number of times, the cycle including: supplying an organic-based source containing a prescribed element into a process chamber in which the substrate is housed, and confining the organic-based source in the process chamber; maintaining a state in which the organic-based source is confined in the process chamber, and exhausting an inside of the process chamber.

SUMMARY OF THE INVENTION

Problem to be Solved by the Invention

In the abovementioned film formation processing, a film formation rate, a film formation temperature, and a film property, etc., of a film formed on the substrate, is determined by a property (kind) of the organic-based source confined in the process chamber. Therefore, when a source of a single species is used as the organic-based source, it is difficult to change the film formation rate, the film formation temperature, and the film property, etc., of a film formed on the substrate.

A main object of the present invention is to provide a technique capable of changing the film formation rate, the film formation temperature, and the film property, etc., of the film formed on the substrate, even when the source of a single species is used as the organic-based source confined in the process chamber in which the substrate is housed.

Means for Solving the Problem

According to an aspect of the present invention, there is provided a method of manufacturing a semiconductor device, including:

forming a film containing a prescribed element and carbon on a substrate, by performing a prescribed number of times a cycle including:

supplying an organic-based source containing a prescribed element, and a pseudo catalyst including at least one selected from the group consisting of a halogen compound and a boron compound, into a process chamber in which the substrate is housed, and confining the organic-based source and the pseudo catalyst in the process chamber;

maintaining a state in which the organic-based source and the pseudo catalyst are confined in the process chamber; and exhausting an inside of the process chamber.

According to other aspect of the present invention, there is provided a substrate processing apparatus, including:

a process chamber in which a substrate is housed;

an organic-based source supply system configured to supply an organic-based source containing a prescribed element into the process chamber;

a pseudo catalyst supply system configured to supply a pseudo catalyst including at least one selected from the group consisting of a halogen compound and a boron compound into the process chamber;

an exhaust system configured to exhaust an inside of the process chamber; and a control part configured to control the organic-based source supply system, the pseudo catalyst supply system, and the exhaust system, so as to perform a processing of forming a film containing the prescribed element and carbon on the substrate, by performing a cycle a prescribed number of times, the cycle including:

a process of supplying the organic-based source and the pseudo catalyst into the process chamber in which the substrate is housed, and confining the organic-based source and the pseudo catalyst in the process chamber;

a process of maintaining a state in which the organic-based source and the pseudo catalyst are confined in the process chamber; and a process of exhausting the inside of the process chamber.

According to further other aspect of the present invention, there is provided a non-transitory computer-readable recording medium storing a program that causes a computer to perform a procedure of forming a film containing a prescribed element and carbon on a substrate by performing a prescribed number of times a cycle including:

a procedure of supplying the organic-based source containing the prescribed element, and a pseudo catalyst including at least one selected from the group consisting of a halogen compound and a boron compound, into the process chamber in which the substrate is housed, and confining the organic-based source and the pseudo catalyst in the process chamber;

a procedure of maintaining a state in which the organic-based source and the pseudo catalyst are confined in the process chamber; and a procedure of exhausting an inside of the process chamber.

Advantage of the Invention

According to the present invention, a film formation rate, a film formation temperature, and a film property, etc., of a film formed on a substrate, can be changed, even when a source of a single species is used as an organic-based source confined in a process chamber in which the substrate is housed.

DETAILED DESCRIPTION OF THE PREFERRED EMBODIMENTS

An Embodiment of the Present Invention

An embodiment of the present invention will be described hereafter, using FIG. 1 to FIG. 3.

(1) CONFIGURATION OF A SUBSTRATE PROCESSING APPARATUS

Figure 1:
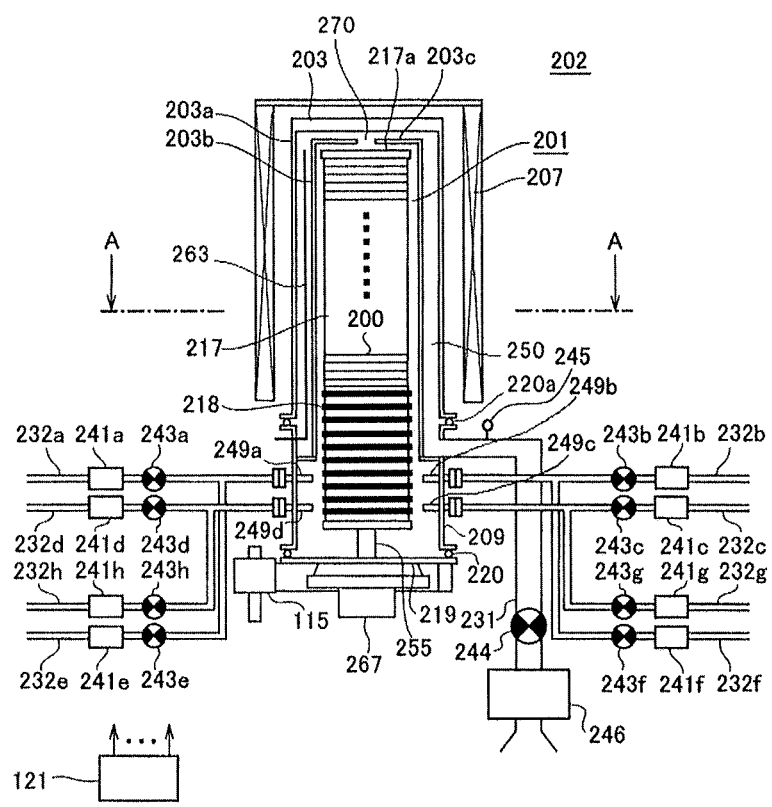
FIG. 1 is a schematic configuration diagram of a vertical processing furnace of a substrate processing apparatus suitably used in an embodiment of the present invention, and a view showing a vertical cross-sectional view of a processing furnace part.
Figure 2:
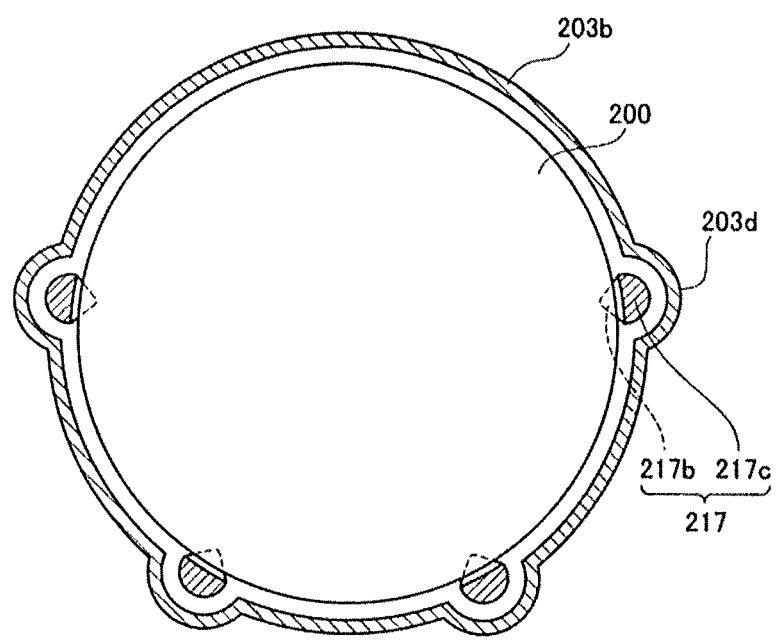
FIG. 2 is a schematic configuration diagram of a part of the vertical processing furnace of the substrate processing apparatus suitably used in an embodiment of the present invention, and is a view showing a part of the processing furnace taken along the line A-A of FIG. 1.

As shown in FIG. 1, a processing furnace 202 includes a heater 207 as a heating unit (heating mechanism). The heater 207 has a cylindrical shape, and is vertically disposed by being supported by a heater base (not shown) as a holding plate. As described later, the heater 207 also functions as an activation mechanism (excitation part) for thermally decomposing and activating (exciting) a gas.

A process tube 203 as a reaction tube is arranged inside of the heater 207 to constitute a reaction vessel (processing vessel) concentrically with the heater 207. The process tube 203 is constituted of an inner tube 203b as an inside reaction tube and an outer tube 203a as an outside reaction tube provided outside of the inner tube 203b.

The inner tube 203b is made of a heat resistant material such as quartz ($SiO_2$) or silicon carbide (SiC), etc., for example, and is formed into a cylindrical shape, with an upper end (upper end part) and a lower end (lower end part) opened. A plurality of wafers 200 as substrates which are subjected to thin film formation processing, are housed in a cylindrical hollow part of the inner tube 203b, in a state of being arranged in multiple stages. An area for housing the wafers 200 in the inner tube 203b is also called a wafer arrangement area (substrate arrangement area).

An upper end part (ceiling part) 203c of the inner tube 203b is configured to cover at least a part of an upper end surface (top board) 217a of a boat 217 as a support described later. It can be said that the upper end part 203c of the inner tube 203b has a configuration of covering at least a part of the surface of the wafer 200. The upper end part 203c of the inner tube 203b is provided in parallel to the upper end surface 217a of a boat 217, and is provided in parallel to a flat-formed surface of the wafer 200, with at least its inner surface having a flat configuration. An outer surface of the upper end part 203c of the inner tube 203b also has a flat configuration. The upper end part 203c of the inner tube 203b is extended toward an inside of the inner tube 203b from the upper end of a side wall part of the inner tube 203b. Therefore, the upper end part 203c can be called an extending part. A communication part (opening part) 270 is provided in a central part (center part) of the upper end part 203c of the inner tube 203b, for a communication between the inside of the inner tube 203b and the inside of the outer tube 203a described later. That is, the upper end part 203c of the inner tube 203b is configured by a donut-shaped (ring-like) plate member (plate) having an opening part in its center part. From this shape, the upper end part 203c of the inner tube 203b can also be called an orifice-like member or simply orifice. The communication part 270 may be provided at a portion other than the central part of the upper end part 203c of the inner tube 203b, for example may be provided on a circumferential edge, etc., of the upper end part 203c, and further may be provided on a side wall part of the inner tube 203b. However, when the communication part 270 is provided on the side wall part of the inner tube 203b, it is preferably provided in an upper part of the wafer arrangement area and in the vicinity of the upper end part 203c, or in a lower part of the wafer arrangement area and at a portion included in an area horizontally surrounding an insulation board arrangement area in which a plurality of insulation boards 218 described later are arranged in multiple stages.

The outer tube 203a is composed of quartz or a heat resistant material such as SiC, etc., and is formed into a cylindrical shape, with an inner diameter larger than an outer diameter of the inner tube 203b, and an upper end (upper end part) closed and a lower end (lower end part) opened. The outer tube 203a is provided concentrically with the inner tube 203b. The upper end part (ceiling part) of the outer tube 203a is configured to cover the upper end part (ceiling part) 203c of the inner tube 203b.

The upper end part of the outer tube 203a is provided in parallel to the upper end part 203c of the inner tube 203b, and in parallel to the upper end surface (top board) 217a of the boat 217, and in parallel to the surface of the wafer 200, with at least its inner surface having a flat configuration. That is, the inner surface of the upper end part of the outer tube 203a is formed as a flat surface. The outer surface of the upper end part of the outer tube 203a also has a flat configuration, namely which is a flat surface. The upper end part of the outer tube 203a is configured in such manner that its thickness is larger than a thickness of the side wall part of the outer tube 203a, so that a strength of the outer tube 203a can be maintained even when the inside of the outer tube 203a is set in a prescribed degree of vacuum. The upper end part of the outer tube 203a is configured in such a manner that its thickness is larger than the thicknesses of the upper end part 203c of the inner tube 203b and the side wall part of the inner tube 203b.

The process chamber 201 is mainly configured by the outer tube 203a and the inner tube 203b having the abovementioned configurations. The process chamber 201 is configured to house the wafers 200 by the boat 217 described later, so as to be arranged in a horizontal posture vertically in multiple stages.

Owing to the abovementioned configurations of the outer tube 203a and the inner tube 203b, a substantial volume (capacity) of the process chamber 201 can be reduced, and owing to a decomposition of a process gas described later, an area in which active substances (called active species hereafter) are generated, can be reduced (narrowed to a minimum), and generation of a variety of active species can be suppressed.

That is, owing to a flat-flat configuration of forming the inner surface of the upper end part (ceiling part) of the outer tube 203a to be flat, and forming the outer surface of the upper end part (ceiling part) 203c of the inner tube 203b to be flat respectively, the volume of a space sandwiched between these ceiling parts can be reduced. Thus, the substantial volume (capacity) of the process chamber 201 can be reduced, and the area in which the active species are generated due to the decomposition of the process gas, can be narrowed (reduced), and the generation of the variety of active species can be suppressed. Further, owing to the flat-flat configuration of covering at least a part of the upper end surface 217a of the boat 217 which is configured to be flat, by the upper end part 203c of the inner tube 203b, while configuring the inner surface of the upper end part 203c of the inner tube 203b to be flat, the volume (capacity) of the space sandwiched between the inner surface of the upper end part 203c of the inner tube 203b and the upper end surface 217a of the boat 217, can be reduced. Thus, the substantial volume (capacity) of the process chamber 201 can be further reduced, and the area in which the active species are generated due to the decomposition of the process gas, can be further narrowed (reduced), and the generation of the variety of active species can be further suppressed.

Further, by reducing the volume of the space sandwiched between the inner surface of the upper end part (ceiling part) of the outer tube 203a and the outer surface of the upper end part (ceiling part) 203c of the inner tube 203b, and reducing the volume of the space sandwiched between the inner surface of the upper end part 203c of the inner tube 203b and the upper end surface 217a of the boat 217, the active species generated in these spaces can be easily consumed and extinguished. As a result, the concentration of the active species in these spaces can be properly reduced.

That is, by increasing the ratio of a surface area with respect to the volume of the space sandwiched between the inner surface of the ceiling part of the outer tube 203a and the outer surface of the ceiling part of the inner tube 203b (surface area/volume), the ratio of "an amount of the active species consumed by contact with the surface of the space (surface of a member such as outer tube 203a and inner tube 203b, etc.) with respect to "an amount of the active species generated in this space" (consumption/generation), can be increased. Similarly, by increasing the ratio of a surface area with respect to the volume of the space sandwiched between the inner surface of the upper end part 203c of the inner tube 203b and the upper end surface 217a of the boat 217 (surface area/volume), the ratio of "the amount of the active species consumed by contact with the surface of the space (surface of a member such as inner tube 203b and boat 217, etc.)" with respect to "the amount of the active species generated in this space" (consumption/generation), can be increased. That is, by configuring these spaces so that the ratio of the surface area with respect to the volume is large, the active species generated in these spaces can be easily consumed. As a result, the concentration of the active species in these spaces can be properly reduced.

Further, according to the configuration in which the upper end part 203c of the inner tube 203b covers at least a part of the upper end surface (top board) 217a of the boat 217 and further the communication part 270 is provided on the upper end part 203c of the inner tube 203b, a distance for the active species to reach the wafer 200 can be extended, the active species being reactive species generated in the space in an upper part of the upper end surface 217a of the boat 217, or in the space between the outer tube 203a and the inner tube 203b. Then, the active species can be prevented from contact with the wafer 200.

That is, as a result of having the abovementioned configuration, the active species generated in the space sandwiched between the inner surface of the upper end part 203c of the inner tube 203b and the upper end surface 217a of the boat 217, cannot reach the wafer 200, unless they bypass an edge of the upper end surface 217a of the boat 217. Further, as a result of having the abovementioned configuration, the communication part 270 provided on the upper end part 203c of the inner tube 203b, is opposed to the upper end surface 217a of the boat 217 so as to be closed by the upper end surface 217a of the boat 217. Therefore, the active species generated in the space sandwiched between the outer tube 203a and the inner tube 203b, cannot reach the wafer 200 unless they move through the space and pass through the communication part 270 and thereafter bypass the edge of the upper end surface 217a of the boat 217. Thus, by making the active species bypass, the active species being generated in the space in the upper part of the upper end surface 217a of the boat 217, or in the space between the outer tube 203a and the inner tube 203b, the distance (route) for these active species to reach the wafer 200 can be extended, and these active species can be consumed and extinguished before they reach the wafer 200. That is, the active species generated in these parts can be prevented from contact with the wafer 200. Particularly, when the communication part 270 is provided in the center part of the upper end part 203c of the inner tube 203b, the distance for the active species passing through the communication part 270, to reach the wafer 200 can be extended to maximum, and it is more easy to prevent these active species from contact with the wafer 200.

According to these configurations, a concentration distribution of the active species in the process chamber 201, particularly in the wafer arrangement area, can be uniform. It is also possible to suppress an influence of the active species on a film thickness and a film quality, the active species being generated in the space in the upper part of the upper end part 217a of the boat 217 or in the space between the outer tube 203a and the inner tube 203b. As a result, it would be possible to improve the uniformity of the film thickness and the film quality of a thin film formed on the wafer 200 in-plane and inter-plane of the wafer.

Further, in the abovementioned configuration, it is preferable to set a distance to be narrowed between an inner wall of a side wall of the inner tube 203b (simply called an inner wall of the inner tube 203b hereafter) and the edge of the wafer 200. For example, it is preferable to set the distance between the inner wall of the inner tube 203b and the edge of the wafer 200, to be equal or smaller to/than a distance between adjacent wafers 200 (wafer arrangement pitch). However, as shown in FIG. 2, the boat 217 described later has a boat pillar (boat strut) 217c having a locking groove 217b for supporting the wafer 200, and the boat pillar 217c is positioned outside of the wafer 200. Therefore, if the distance between the inner wall of the inner tube 203b and the edge of the wafer 200 is narrowed, the inner wall of the inner tube 203b and the boat pillar 217c are in contact with each other, and the distance between the inner wall of the inner tube 203b and the edge of the wafer 200 cannot be narrowed any more. That is, the boat pillar 217c is a hindrance to narrow the distance between the inner wall of the inner tube 203b and the edge of the wafer 200. Therefore, in order to narrow the distance between the inner wall of the inner tube 203b and the edge of the wafer 200, for example, as shown in FIG. 2, it is preferable to provide a boat pillar groove 203d as a space (recess portion) to avoid the boat pillar 217c, at a portion corresponding to the boat pillar 217c on the inner wall of the inner tube 203b. In FIG. 2, only the inner tube 203b, the boat 217, and the wafer 200 supported by the boat 217 are extracted to be shown for the convenience.

Owing to this configuration, namely, owing to the configuration in which the recess portion is provided on the inner wall of the inner tube 203b so as to avoid a member constituting the boat 217, the distance between the inner wall of the inner tube 203b and the edge of the wafer 200 can be reduced to minimum.

Thus, by reducing the distance between the inner wall of the inner tube 203b and the edge of the wafer 200 to minimum, the substantial volume of the process chamber 201 can be reduced, then the area in which the active species are generated can be reduced, and the generation of the variety of active species can be suppressed. With this configuration, the influence of the active species on the film thickness and the film quality can be further suppressed, and further, it would be possible to realize a uniform film thickness and film quality in-plane and inter-plane of the wafer.

The shape of the inner tube 203b thus configured having the upper end part 203c and the side wall part, can also be called approximately a cylindrical shape, compared to a pure cylindrical shape.

A manifold 209 is arranged in a lower part of the outer tube 203a concentrically with the outer tube 203a. The manifold 209 is made of stainless (SUS), etc., for example, and formed into a cylindrical shape with an upper end and a lower end opened. The manifold 209 is provided so as to be engaged with the inner tube 203b and the outer tube 203a to support them. O-ring 220a is provided between the manifold 209 and the outer tube 203a as a seal member. By supporting the manifold 209 by a heater base, the process tube 203 is in a vertically installed state. A reaction vessel (process vessel) is mainly configured by the process tube 203 and the manifold 209.

Nozzles 249a to 249d as gas inlet parts, are connected to the manifold 209 so as to pass through the side wall of the manifold 209, and communicate with the inside of the process chamber 201. Gas supply pipes 232a to 232d are connected to the nozzles 249a to 249d respectively. Thus, four nozzles 249a to 249d, and four gas supply pipes 232a to 232d are provided on the reaction tube 203, so that a plurality of kinds of process gases, and four kinds here, can be supplied into the process chamber 201.

Mass flow controllers (MFC) 241a to 241d, which are flow rate controllers (flow rate control parts), and valves 243a to 243d, which are open/close valves, are respectively provided on the gas supply pipes 232a to 232d, sequentially from an upstream direction. Further, gas supply pipes 232e to 232h are respectively connected to a downstream side of the valves 243a to 243d of the gas supply pipes 232a to 232d, for supplying an inert gas. MFC 241e to 241h which are flow rate controllers (flow rate control parts) and valves 243e to 243h which are open/close valves, are respectively provided on the gas supply pipes 232e to 232h, sequentially from the upstream direction. Further, the abovementioned nozzles 249a to 249d are respectively connected to tip parts of the gas supply pipes 232a to 232d.

An organic-based source containing prescribed elements, for example, an organic silane-based gas containing silicon (Si) as the prescribed elements, and carbon (C), is supplied into the process chamber 201 from the gas supply pipe 232a, etc., through the MFC 241a, valve 243a, and nozzle 249a. Here, the organic silane-based gas is an organic silane-based source in a gas state, for example is the gas obtained by vaporizing the organic silane-based source in a liquid state under normal temperature and normal pressure, or the organic silane-based source in a gas state under normal temperature and normal pressure, etc. When the term of "source" is used in this specification, this shows a case meaning the "liquid source in a liquid state", or the "source gas in a gas state", or both of them. Accordingly, when the term of the "organic silane-based source" is used in this specification, this shows a case meaning the "organic silane-based source in a liquid state", or a case meaning the "organic silane-based source gas in a gas state (organic silane-based gas)", or both of them.

As the organic silane-based source, it is preferable to use an organic compound composed of only three elements of Si, C, and hydrogen (H). That is, as the organic silane-based source, it is preferable to use the organic compound containing the bond of Si and C (Si—C bond), the bond of Si and H (Si—H bond), and the bond of C and H (C—H bond) respectively in a chemical structural formula (in a composition formula, in one molecule). Also, as the organic silane-based source, it is preferable to use the organic compound having a chain compound (acyclic compound) including a chain structure of C, namely, the organic compound having a molecule structure of a chain-like bond of C in its molecule, that is, a straight molecule structure not having even one ring in its chemical structural formula. As the chain compound, not only a straight-chain compound having no branch, but also a chain compound having a branch, can be used. Specifically, as the organic silane-based source, it is preferable to use the organic compound including a chain structure of a chain-like bond of C, Si that binds with C constituting the chain skeleton, and H that binds with C respectively constituting these chain-like skeletons and Si that binds therewith in its chemical structural formula. Also, as the organic silane-based source, the organic compound having only one C, namely, the organic compound having no chain structure of C, can be used. The organic silane-based source acts as Si source (silicon source) and C source (carbon source) when forming SiC film.

As the organic silane-based source, for example, 1,4-disilabutane ($Si_2C_2H_{10}$, abbreviation: DSB) can be used. When a liquid source in a liquid state under normal temperature and normal pressure is used as the organic silane-based source, the liquid source is vaporized by a vaporizing system such as a vaporizer or a bubbler, etc., and supplied as an organic silane-based gas.

The pseudo catalyst including at least one selected from the group consisting of a halogen compound and a boron compound, is supplied from the gas supply pipe 232b into the process chamber 201 through the MFC 241b, the valve 243b, and the nozzle 249b. The "catalyst" called here, is a substance not changed by itself before/after a chemical reaction, but a reaction speed is changed by this substance. On the other hand, the reaction speed, etc., is changed by the halogen compound and the boron compound in a reaction system of this embodiment, wherein the halogen compound and the boron compound are changed by themselves before/after the chemical reaction as described later. That is, although the halogen compound and the boron compound in the reaction system of this embodiment have a catalytic action, strictly speaking, they are not "catalyst". Thus, the substance which is changed by itself before/after the chemical reaction although having the catalytic action, is called a "pseudo catalyst" in this specification.

The substance containing at least one selected from the group consisting of an inorganic halogen compound and an inorganic boron compound, can be used as the pseudo catalyst. Further, as the pseudo catalyst, the substance containing at least one selected from the group consisting of an inorganic halogen compound not containing a prescribed element (not containing Si) and an inorganic boron compound not containing Si, can be used. Specifically, as the pseudo catalyst, it is preferable to use at least one of the halogen compound not containing Si and C, the boron compound not containing Si and C, and halogenated boron not containing Si and C.

As the pseudo catalyst, for example, trichloro borane ($BCl_3$) can be used. $BCl_3$ actions as the pseudo catalyst in the reaction system of this embodiment. $BCl_3$ is in a gas state under normal temperature and normal pressure, and therefore it is not vaporized by the vaporization system such as a vaporizer or a bubbler, etc., and can be supplied as $BCl_3$ gas.

For example, oxygen ($O_2$) gas is supplied into the process chamber 201 from the gas supply pipe 232c as an oxidizing gas, namely as an oxygen-containing gas, through the MFC 241c, valve 243c, and nozzle 249.

For example, an ammonium ($NH_3$) gas is supplied into the process chamber 201 from the gas supply pipe 232d as a nitriding gas, namely, as a nitrogen-containing gas, through the MFC 241d, the valve 243d, and the nozzle 249d.

From the gas supply pipes 232e to 232h, for example, a nitrogen ($N_2$) gas is supplied into the process chamber 201 as an inert gas, through the MFCs 241e to 241h, the valves 243e to 243h, the gas supply pipes 232a to 232d, and the nozzles 249a to 249d.

When the abovementioned gases are flowed from each gas supply pipe, an organic silane-based gas supply system is constructed as an organic-based source supply system mainly including the gas supply pipe 232a, the MFC 241a, and the valve 243a. It may be acceptable that the nozzle 249a may be included in the organic-based source supply system. Also, a halogen compound supply system or a boron compound supply system are constructed as a pseudo catalyst supply system, including the gas supply pipe 233b, MFC 241b, and valve 243b. It may be acceptable that the nozzle 249b is included in the pseudo catalyst supply system. Also, an oxygen-containing gas supply system is constructed as an oxidizing gas supply system, including the gas supply pipe 232c, MFC 241c, and valve 243c. It may be acceptable that the nozzle 249d is included in the oxygen-containing gas supply system. Also, a nitrogen-containing gas supply system is constructed as a nitriding gas supply system, including the gas supply pipe 232d, MFC 241d, and valve 243d. It may be acceptable that the nozzle 249c is included in the nitrogen-containing gas supply system. Also, an inert gas supply system is constructed including the gas supply pipes 232e to 232h, MFCs 241e to 232h, and valves 243e to 243h. The inert gas supply system also actions as a purge gas supply system.

The organic-based source, pseudo catalyst, oxidizing gas, and nitriding gas can be called a process gas, and in this case, at least one of the organic-based source supply system, pseudo catalyst supply system oxidizing gas supply system and nitriding gas supply system, can be simply called a process gas supply system. For example, the organic-based source supply system can be called the process gas supply system, and the pseudo catalyst supply system can be called the process gas supply system, the organic-based source supply system and the pseudo catalyst supply system can be called the process gas supply system, and these all supply systems can be called the process gas supply system.

An exhaust pipe 231 is provided on the manifold 209, for exhausting an atmosphere in the process chamber 201. The exhaust pipe 231 is arranged at a lower edge of a cylindrical space 250 formed by a gap between the inner tube 203b and the outer tube 203a, so as to communicate with the cylindrical space 250. A vacuum pump 246 as a vacuum exhaust device is connected to the exhaust pipe 231 through a pressure sensor 245 as a pressure detector (pressure detection part) for detecting a pressure in the process chamber 201, and APC (Auto Pressure Controller) valve 244 as a pressure regulator (pressure regulation part). The APC valve 244 is the valve configured to perform vacuum exhaust and stop of vacuum exhaust in the process chamber 201 by opening/closing a valve in a state of activating the vacuum pump 246, and further is configured to regulate the pressure in the process chamber 201 by regulating a degree of valve opening based on pressure information detected by the pressure sensor 245 in a state of activating the vacuum pump 246. An exhaust system is constructed mainly by the exhaust pipe 231, APC valve 244, and pressure sensor 245. It may be acceptable that the vacuum pump 246 is included in the exhaust system.

A seal cap 219 is provided in the lower part of the manifold 209 as a furnace throat lid member capable of air-tightly closing a lower end opening of the manifold 209. The seal cap 219 is configured to abut on the lower end of the manifold 209 from a vertical lower side. The seal cap 219 is made of a metal such as SUS, etc., for example, and is formed into a disc shape. An O-ring 220 is provided on an upper surface of the seal cap 219 as a seal member that abuts on the lower end of the manifold 209. A rotation mechanism 267 for rotating the boat 217 described later, is installed on an opposite side of the seal cap 219 of the process chamber 201. A rotary shaft 255 of the rotation mechanism 267 is connected to the boat 217 described later, passing through the seal cap 219. The rotation mechanism 267 is configured to rotate the wafer 200 by rotating the boat 217. The seal cap 219 is configured to be vertically elevated by a boat elevator 115 as an elevation mechanism installed vertically outside of the process tube 203. The boat elevator 115 is configured to load and unload the boat 217 into/from the process chamber 201 by elevating the seal cap 219. The boat elevator 115 is configured as a transfer device (transfer mechanism) for transferring the boat 217 namely the wafer 200 into/from the process chamber 201.

The boat 217 as a support is made of a heat resistant material such as quartz or SiC, etc., for example, and is configured to support a plurality of wafers 200 in a horizontal posture, which are arranged with centers of them aligned to each other in multiple stages. As shown in FIG. 1 and FIG. 2, the boat 217 has at least a top board 217a constituting an upper end surface of the boat 217, and a plurality of (four in this case) boat pillars 217c.

The top board 217a is configured as a flat plate-like member, and is configured to entirely cover an upper part of the wafer 200, namely, the upper part (flat surface) of the wafer 200 disposed on an uppermost level (uppermost part) in the wafer arrangement area. Thus, a distance for the active species to reach the wafer 200 can be extended, the active species being generated in the space above the upper end surface 217a of the boat 217. Further, when the boat 217 is loaded into the process chamber 201, the top board 217a is configured to oppose to a communication part 270 provided on the upper end part 203c of the inner tube 203b, namely, to close the communication part 270. Thus, the distance for the active species to reach the wafer 200 can be extended after passing through the communication part 270, the active species being generated in the space between the outer tube 203a and the inner tube 203b, and it would be possible to prevent the active species from contact with the wafer 200. As a result, the uniformity of the film thickness and the film quality of the thin film formed on the wafer 200, can be improved in-plane and inter-plane of the wafer.

A plurality of locking grooves (slots) 217b are provided on each boat pillar 217c, for supporting 25 to 200 wafers 200 for example. Each boat pillar 217c is provided so as to be housed inside of a boat pillar groove 203d provided on an inner wall of the inner tube 203b in non-contact state with the boat pillar groove 203d. When the wafers 200 are charged into all locking grooves 217b, it is so configured that the gap between the wafer 200 disposed on the uppermost level in the wafer arrangement area and the top board 217a is equal to a distance between adjacent wafers 200 (wafer arrangement pitch). Thus, when the boat 217 is loaded into the process chamber 201, the substantial volume (capacity) of the process chamber 201 can be reduced, then the area in which the active species are generated due to decomposition of the process gas can be reduced (narrowed to minimum), and the generation of the variety of active species can be suppressed. Then, the influence of the active species on the film thickness and the film quality can be suppressed, and the uniform film thickness and film quality can be realized in-plane and inter-plane of the wafer.

The heat insulation board 218 made of a heat resistant material such as quartz or SiC, etc., for example, is supported in the lower part of the boat 217 in a horizontal posture and in multiple stages, so that a heat from the heater 207 is hardly transmitted toward the seal cap 219. An insulation cylinder configured as a cylindrical member made of a heat resistant material such as quartz or SiC, etc., may be provided in the lower part of the boat 217, while not providing the heat insulation board 218. The area for housing the heat insulation board 218 in the process chamber 201 (in the processing vessel), is also called a heat insulation board arrangement area.

A temperature sensor 263 as a temperature detector is installed in the process tube 203. By adjusting a power supply state to the heater 207 based on temperature information detected by the temperature sensor 263, the temperature in the process chamber 201 is set to be a desired temperature distribution. The temperature sensor 263 is formed into L-shape, and its horizontal part is provided so as to pass through the manifold 209, and its vertical part is provided so as to rise from one end side to the other end side of at least the wafer arrangement area.

Figure 3:
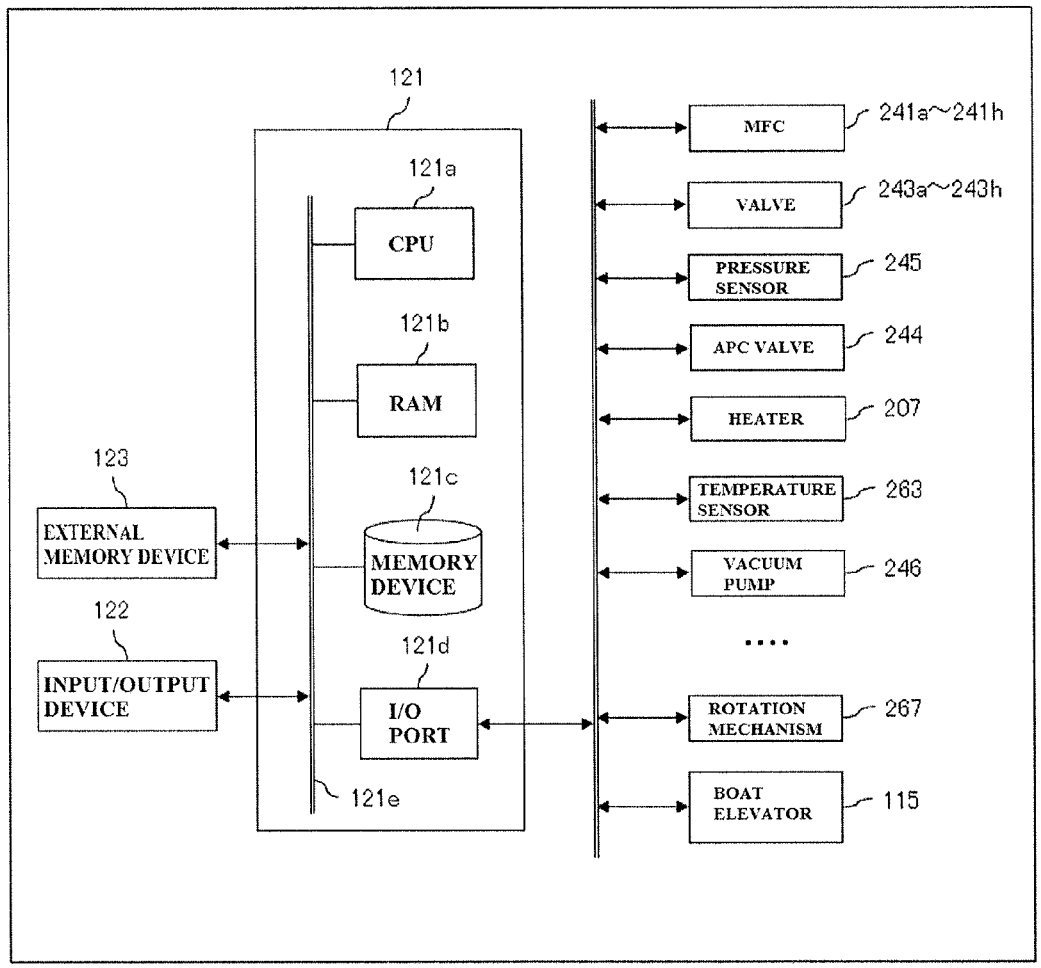
FIG. 3 is a schematic configuration diagram of a controller of the substrate processing apparatus suitably used in an embodiment of the present invention, and is view showing a block diagram of a control system of the controller.

As shown in FIG. 3, the controller 121 which is the control part (control means) is configured as a computer including CPU (Central Processing Unit) 121a, RAM (Random Access Memory) 121b, a memory device 121c, and I/O port 121d. The RAM 121b, the memory device 121c, and the I/O port 121d are configured so that data exchange can be carried out with CPU 121a via an internal bus 121e. An input/output device 122 constituted as a touch panel, etc., for example, is connected to the controller 121.

The memory device 121c is configured by a flash memory and HDD (Hard Disk Drive), etc., for example. A control program for controlling an operation of the substrate processing apparatus, and a process recipe, etc., storing a procedure or a condition of substrate processing described later, are readably stored in the memory device 121c. The process recipe is a combination of recipes so that each procedure in the substrate processing step described later is executed by the controller 121 and a prescribed result can be obtained, and functions as a program. The program recipe and the control program, etc., are generally and simply called the program hereafter. The term of the program is used in the following cases in this specification, meaning the process recipe alone, meaning the control program alone, or meaning the both cases thereof. Further, the RAM 121b is configured as a memory area (work area) in which the program or data, etc., read by the CPU 121a is temporarily stored.

The I/O port 121d is connected to the abovementioned MFCs 241a to 241h, valves 243a to 243h, pressure sensor 245, APC valve 244, vacuum pump 246, heater 207, temperature sensor 263, rotation mechanism 267, and boat elevator 115, etc.

The CPU 121a is configured to read and execute a control program from the memory device 121c, and read the process recipe from the memory device 121c according to input, etc., of an operation command from the input/output device 122. Then, CPU 121a is configured to control a flow rate regulating operation of each kind of gas by MFCs 241a to 241h, open/close operation of the valves 243a to 243h, open/close operation of the APC valve 244 and a pressure regulating operation by the APC valve 244 based on the pressure sensor 245, a temperature adjustment operation of the heater 207 based on the temperature sensor 263, start and stop of the vacuum pump 246, a rotation and a rotation speed adjustment operation of the boat 217 by the rotation mechanism 267, and an elevating operation of the boat 217 by the boat elevator 115, and so forth, so as to comply with a read content of the process recipe.

The controller 121 may be configured not only as a dedicated computer, but also as a general-purpose computer. For example, an external memory device storing the abovementioned program (for example, a magnetic disc such as a magnetic tape or a flexible disc, a hard disc, etc., an optical disc such as CD or DVD, etc., a magneto-optical disc such as MO, etc., and a semiconductor memory such as a USB memory or a memory card, etc.,) 123 is prepared, and the program is installed on the general-purpose computer using this external memory device 123, to thereby constitute the controller 121 of this embodiment. The means for supplying the program to the computer is not limited to the case that it is supplied via the external memory device 123. For example, the program may be supplied not via the external memory device 123, using a communication means such as an Internet or a dedicated line, etc. The memory device 121c and the external memory device 123 are configured as a non-transitory computer-readable recording medium. They are genetically simply called a recording medium. The term of the recording medium is used in the following cases in this specification, meaning the memory device 121c alone, meaning the external memory device 123 alone, or meaning the both cases thereof.

(2) SUBSTRATE PROCESSING STEP

Figure 4:
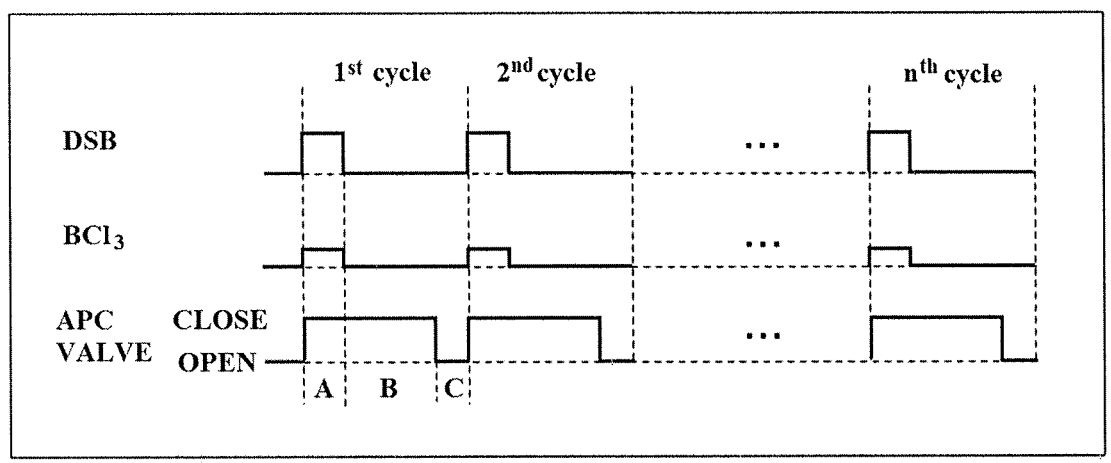
FIG. 4 is a view showing a film formation sequence according to an embodiment of the present invention.

Next, using FIG. 4, explanation is given for an example of a method of forming a thin film on the wafer 200 as a substrate, as one of the steps of manufacturing a semiconductor device, using a processing furnace 202 of the substrate processing apparatus. In the following explanation, the operation of each part constituting the substrate processing apparatus, is controlled by the controller 121.

Here, as an example, explanation is given for a case of forming a film containing Si and C, namely, a silicon carbide film (SiC film) as a SiC-based film (carbide-based film) on the wafer 200, by performing a prescribed number of times a cycle including:

supplying an organic-based source (DSB gas) containing a prescribed element and a pseudo catalyst ($BCl_3$ gas) containing at least one selected from the group consisting of a halogen compound and a boron compound, into a process chamber 201 in which the wafer 200 is housed, and confining the DSB gas and the $BCl_3$ gas in the process chamber 201;

maintaining a state in which the DSB gas and the $BCl_3$ gas are confined in the process chamber 201; and exhausting an inside of the process chamber 201. Explanation is also given here for a case of forming the SiC film in non-plasma atmosphere.

The DSB gas actions as Si source (silicon source) and C source (carbon source) when forming the SiC film. The $BCl_3$ gas is the halogenated boron not containing Si, and therefore does not action as a silicon source or a carbon source. Namely, the $BCl_3$ gas does not action as a "source", and in the reaction system of this embodiment, the $BCl_3$ gas actions like a "catalyst" that changes a speed, etc., of a film formation reaction. However, the $BCl_3$ gas of this embodiment itself is changed before/after the chemical reaction as described later, and therefore strictly speaking, the $BCl_3$ gas is different from the "catalyst".

In this embodiment, using a semiconductor silicon wafer as the wafer 200, formation of the SiC-based film is performed as one of the steps of manufacturing a semiconductor device. The SiC-based film such as SiC, etc., is suitably used around a gate electrode or a wiring structure of a transistor, as an insulation film with high etching resistance and oxidation resistance. In this specification, the term of SiC-based film means a film containing at least Si and C, including for example a silicon carbonitride film (SiCN film), a silicon oxycarbide film (SiOC film), and a silicon oxycarbonitride film (SiOCN film), etc., other than the SiC film.

Also, when the term of "wafer" is used in this specification, there are the following two cases: meaning "a wafer itself", meaning "a laminate (aggregate) of a wafer and a prescribed layer or film formed on the surface of the wafer", namely, referring to the prescribed layer and the film, etc., formed on the surface as a wafer. Further, in this specification, when using the term of the "surface of the wafer", there are the following two cases: meaning "the surface (exposed surface) of the wafer itself", and meaning "the surface of the prescribed layer or the film, etc., formed on the wafer, namely, an outermost surface of the wafer as a laminate".

Accordingly, in this specification, when described as "a prescribed gas is supplied to the wafer", there are the following two cases: meaning "the prescribed gas is directly supplied to the surface (exposed surface) of the wafer itself", and meaning "the prescribed gas is supplied to the layer or the film, etc., formed on the wafer, namely, to the outermost surface of the wafer as a laminate". Further, in this specification, when described as "a prescribed layer (or a film) is formed on the wafer", there the following two cases: meaning "the prescribed layer (or the film) is directly formed on the surface (exposed surface) of the wafer itself", and meaning "the prescribed layer (or the film) is formed on the layer or the film formed on the wafer, namely, on the outermost surface of the wafer as a laminate".

In this specification, when using the term of a "substrate" as well, the same thing can be said as the case of using the term of "wafer". In this case, the "wafer" may be replaced by the "substrate".

(Wafer Charge and Boat Load)

A plurality of wafers 200 are charged into the boat 217 (wafer charge). At this time, the wafer 200 is charged so that an empty slot is not generated over an entire area of the wafer arrangement area. Thus, the substantial volume (capacity) of the process chamber 201 can be reduced during processing the substrate, then the area in which the active species are generated due to decomposition of the process gas can be reduced (narrowed to minimum), and the generation of a variety of active species can be suppressed. Then, the influence of the active species on the film thickness and the film quality can be suppressed, and the uniform film thickness and film quality can be realized in-plane and inter-plane of the wafer. Particularly, by charging the wafer 200 so that the empty slot is not generated at a portion close to at least the communication part 270 in the wafer arrangement area, in the upper part of the wafer arrangement area in this embodiment, the volume (capacity) of the area close to the communication part 270 can be reduced, and the generation of the active species in the vicinity of the communication part 270 can be suppressed. As a result, the influence of the active species on the film thickness and the film quality of the wafer 200 arranged in the vicinity of the communication part 270, can be properly suppressed.

Thereafter, as shown in FIG. 1, the boat 217 supporting a plurality of wafers 200, is lifted by the boat elevator 115 and loaded into the process chamber 201 (boat load), and the plurality of wafers 200 are housed in the process chamber 201. In this state, the seal cap 219 is set in a state of sealing the lower end of the process vessel, namely, the lower end of the manifold 209 via the O-ring 220.

(Pressure Regulation and Temperature Regulation)

The inside of the process chamber 201 is vacuum-exhausted by the vacuum pump 246 so that the pressure in the process chamber 201, namely, the pressure of a space in which the wafer 200 exists, is a desired pressure (degree of vacuum). At this time, the pressure in the process chamber 201 is measured by the pressure sensor 245, and based on the measured pressure information, the APC valve 244 is feedback controlled (pressure regulation). The vacuum pump 246 is maintained in an operation state at all times until at least the end of the processing applied to the wafer 200. Also, the wafer 200 in the process chamber 201 is heated by the heater 207 so as to be a desired temperature. At this time, the power supply state to the heater 207 is feedback controlled based on the temperature information detected by the temperature sensor 263 (temperature regulation). Heating the inside of the process chamber 201 by the heater 207, is continuously performed until at least the end of the processing applied to the wafer 200.

Thereafter, the valves 243e to 232h are opened, and $N_2$ gas of several liters per minute for example, is supplied into the process chamber 201 from the gas supply pipes 232e to 243h, through the MFCs 241e to 241h, gas supply pipes 232a to 232d, and nozzles 249a to 249d. Nitrogen purge of the inside of the process chamber 201 is executed for several minutes with the pressure in the process chamber as an arbitrary pressure, and thereafter supply of the $N_2$ gas is stopped, and the nitrogen purge is ended.

Thereafter, the inside of the process chamber 201 is vacuum-exhausted by the vacuum pump 246 in a full-open state of the APC valve 244, to set a base pressure in the process chamber 201 to 1 Pa or less. When the pressure in the process chamber 201 is 1 Pa or less, the APC valve 244 is completely closed. At this time, the APC valve 244 is not required to be completely closed, and may be slightly opened.

(SiC Film Forming Step)

The valve 243a is opened, with the APC valve 244 completely closed, and DSB gas is flowed into the gas supply pipe 232a. The DSB gas is supplied into the process chamber 201 through the nozzle 249a, with its flow rate regulated by the MFC 241a. Simultaneously, the valve 243b is opened, and the $BCl_3$ gas is flowed into the gas supply pipe 232b. The $BCl_3$ gas is supplied into the process chamber 201 through the nozzle 249b, with its flow rate regulated by the MFC 241b. After elapse of a prescribed time, the valves 243a and 243b are simultaneously closed, to stop supply of the DSB gas and the $BCl_3$ gas into the process chamber 201. By these operations, the DSB gas and the $BCl_3$ gas are confined in the process chamber 201 (step A).

When supply of the DSB gas and the $BCl_3$ gas into the process chamber 201 is stopped, the APC valve 244 is completely closed and this state is continued for a prescribed time (reaction duration), to maintain a state in which the DSB gas and the $BCl_3$ gas are confined in the process chamber 201 (step B).

In step A, or in step A and step B, in order to promote a diffusion of the DSB gas and the $BCl_3$ gas in the process chamber 201, the valves 243e and 243f are opened, and $N_2$ gas may be flowed into the process chamber 201, through the gas supply pipes 232e, 232f, 232a, 232b, the nozzles 249a and 249b. Also, in order to prevent the invasion of the DSB gas and the $BCl_3$ gas into the nozzles 249c and 249d, the valves 243g and 243h are opened, and the $N_2$ gas may be flowed into the process chamber 201, through the gas supply pipes 232g, 232h, 232c, 232d, the nozzles 249c and 249d.

In step A, or in step A and step B, by not completely closing but slightly opening the APC valve 244, the DSB gas and the $BCl_3$ gas may be slightly exhausted and a gas flow may be slightly formed. In this case, in step A, or in step A and step B, the DSB gas and the $BCl_3$ gas are exhausted from the process chamber 201 while supplying them into the process chamber 201. At this time, an exhaust rate of the DSB gas and the $BCl_3$ gas from the process chamber 201, is set to be smaller than a supply rate of the DSB gas and the $BCl_3$ gas into the process chamber 201, and by maintaining this state, the DSB gas and the $BCl_3$ gas may be slightly exhausted. Namely, in step A, or in step A and step B, the exhaust rate in total from the process chamber 201 (gas exhaust amount, namely, an exhaust flow rate (volume flow rate) in total per unit time under prescribed pressure) is set to be smaller than the supply rate in total into the process chamber 201 (gas supply amount, namely, supply flow rate (volume flow rate) in total per unit time under prescribed pressure), and by maintaining this state, the DSB gas and the $BCl_3$ gas may be slightly exhausted. In this case, in step A, the following state is formed, namely, the DSB gas and the $BCl_3$ gas are exhausted from the process chamber 201 while supplying them into the process chamber 201, and the exhaust rate of the DSB gas and the $BCl_3$ gas from the process chamber 201 is set to be smaller than the supply rate of the DSB gas and the $BCl_3$ gas into process chamber 201, and this state is maintained in step B.

Thus, even when the gas supplied into the process chamber 201 is slightly exhausted, or slightly exhausted while supplying each gas, a substantially similar confined state as the case of completely closing the APC valve 244, can be formed. Therefore, in this specification, it is considered that the state of slightly exhausting the gas supplied into the process chamber 201, is also included in the confined state. Namely, in this specification, when the term of "confined state" is used, this state includes not only the case that the exhaust of the process chamber 201 is stopped by completely closing the APC valve 244, but also the case that the APC valve is not completely closed but slightly opened, and the exhaust rate from the process chamber 201, of the gas supplied into the process chamber 201 from the process chamber 201 is set to be smaller than the supply rate into the process chamber, of the gas supplied into the process chamber 201, so that this state is maintained, then the gas supplied into the process chamber 201 is slightly exhausted.

In step A, the supply flow rate of the DSB gas controlled by the MFC 241a, is set to be the flow rate within a range of 100 sccm to 2000 sccm for example. When the supply flow rate of the DSB gas is less than 100 sccm, the film formation rate of the SiC film formed on the wafer 200 is extremely reduced, or it becomes difficult to form the SiC film in some cases. Further, when the supply flow rate of the DSB gas is more than 2000 sccm, the film formation rate of the SiC film is extremely increased, and the uniformity of the film thickness of the SiC film, etc., is reduced. Also, in step A, the supply flow rate of the $BCl_3$ gas controlled by the MFC 241b is set to be the flow rate within a range of 0.1 sccm to 500 sccm for example. When the supply flow rate of the $BCl_3$ gas is less than 0.1 sccm, the catalytic action described later by the $BCl_3$ gas is hardly obtained, and the film formation rate of the SiC film is extremely reduced, or it becomes difficult to form the SiC film in some cases. Further, when the supply flow rate of the $BCl_3$ gas is more than 500 sccm, the catalytic action by the $BCl_3$ gas described later is saturated, and the amount of the $BCl_3$ gas not contributing to the catalytic action is increased, thus causing an increase of the film formation cost, etc., in some cases. Further, in step A, or in step A and step B, the supply flow rate of the $N_2$ gas controlled by the MFCs 241e to 241h, is respectively set to be the flow rate within a range of 100 to 10000 sccm for example.

Further, in step A, the supply time of the DSB gas and the $BCl_3$ gas is respectively set to the time within a range of 1 second to 60 seconds for example. It is difficult to set the supply time of the DSB gas and the $BCl_3$ gas to less than 1 second, in terms of controlling valves. When the supply time of the DSB gas and the $BCl_3$ gas is more than 60 seconds respectively, a total time required for step A to step C is excessively long, thus causing a reduction of productivity of the film formation processing in some cases. Namely, it is preferable that a suitable amount of DSB gas and a suitable amount of $BCl_3$ gas are respectively supplied for a short time (execution time in step A is set to be short as much as possible), and the reaction duration (execution time in step B) is preferably set to be long as much as possible.

Further, in step B, the time (reaction duration) for maintaining the confined state of the DSB gas and the $BCl_3$ gas in the process chamber 201, is set to for example, 0.5 to 30 minutes, preferably 0.5 to 20 minutes, and more preferably 0.5 to 10 minutes. It is also acceptable to set the reaction duration to several minutes, 2 to 5 minutes for example, depending on a processing condition. If the reaction duration is set to less than 0.5 minutes, namely, less than 30 seconds, the reaction between the DSB gas and the $BCl_3$ gas described later, is not sufficiently advanced, and the film formation rate of the SiC film is extremely decreased or the film formation of the SiC film becomes difficult in some cases. If the reaction duration is more than 30 minutes, the DSB gas and the $BCl_3$ gas confined in the process chamber 201 are consumed to reduce its amount, and although the reaction required for the film formation is generated, reaction efficiency is reduced. Namely, even if such a state is continued, this is simply a continuation of the film formation in a state of a decreased film formation rate. Namely, if the reaction duration is excessively long, reduction of the productivity of the film formation processing is caused in some cases. By setting the reaction duration to 30 minutes or less, preferably 20 minutes or less, and more preferably 10 minutes or less, the reaction can be continued in a state of high reaction efficiency, namely in a state of high film formation rate.

Further, in step A, the supply flow rate and the supply time of each gas are respectively set in the abovementioned range, so that a pressure (total pressure) in the process chamber 201 in step B, or a total partial pressure of a partial pressure of the DSB gas and a partial pressure of the $BCl_3$ gas in the process chamber 201 in step B is the pressure in a range of 100 to 5000 Pa for example. When the pressure in the process chamber 201 or the total partial pressure of the partial pressure of the DSB gas and the partial pressure of the $BCl_3$ gas in the process chamber 201 is less than 100 Pa, thus extremely decreasing the film formation rate of the SiC film, or making it difficult to form the film formation of the SiC film in some cases. When the pressure in the process chamber 201, or the total partial pressure of the partial pressure of the DSB gas and the partial pressure of the $BCl_3$ gas in the process chamber 201 is more than 5000 Pa, a gas phase reaction is dominant, and the uniformity of the film thickness of the SiC film can be hardly secured. Further, the time required for exhausting the inside of the process chamber 201 in step C described later, becomes long, thus reducing the productivity of the film formation processing in some cases.

Further, in step A, the supply flow rate and the supply time of the DSB gas and the $BCl_3$ gas are respectively set in the abovementioned range so that an amount ratio of the $BCl_3$ gas ([amount of $BCl_3$ gas/total amount of DSB gas and $BCl_3$ gas]×100) in the process chamber 201 in step B, is the ratio in a range of 0.1 to 25% for example. When the abovementioned ratio is less than 0.1%, the catalytic action by the $BCl_3$ gas described later can be hardly obtained, thus extremely decreasing the film formation rate of the SiC film or making it difficult to perform the film formation of the SiC film in some cases. When the abovementioned ratio is more than 25%, the catalytic action by the $BCl_3$ gas described later is saturated, thus increasing the amount of the $BCl_3$ gas not contributing to the catalytic action, and causing the increase, etc., of the film formation cost in some cases.

Further, in steps A and B, the temperature of the heater 207 is set to a temperature of not thermally decomposing the DSB when the DSB gas alone is supplied into the process chamber 201, or to a temperature of making it difficult to decompose the DSB. Specifically, the temperature of the heater 207 is set so that the temperature of the wafer 200 becomes 200° C. or more and 400° C. or less, preferably 250° C. or more and 400° C. or less, and more preferably 300° C. or more and 400° C. or less. When the temperature of the wafer 200 is less than 200° C., the catalytic action by the $BCl_3$ gas described later is hardly obtained, thus extremely decreasing the film formation rate of the SiC film, or making it difficult to perform the film formation of the SiC film in some cases. By setting the temperature of the wafer 200 to 200° C. or more and further 250° C. or more, the catalytic action by the $BCl_3$ gas described later can be obtained, thus increasing the film formation rate of the SiC film. By setting the temperature of the wafer 200 to 300° C. or more, the catalytic action by the $BCl_3$ gas described later can be sufficiently obtained, and the film formation rate of the SiC film can be sufficiently increased. When the temperature of the wafer 200 is more than 400° C., DSB is thermally decomposed, and even without the catalytic action by the $BCl_3$ gas described later, namely, even in a case of using DSB alone without using $BCl_3$, the sufficient film formation rate can be obtained. The temperature of the wafer 200 is set to 400° C. or less, whereby DSB is not thermally decomposed, or is hardly decomposed, and when DSB is used alone, the sufficient film formation rate is hardly obtained, and in this case, the catalytic action by the $BCl_3$ gas described later works effectively. However, the catalytic action by the $BCl_3$ gas described later is generated even in a temperature region more than 400° C. at which DSB is thermally decomposed, and in this case, the film formation rate can be further increased or C-concentration in the SiC film can be increased. This point will be described later.

By performing steps A and B under the abovementioned conditions, the DSB gas and the $BCl_3$ gas are reacted with each other in the process chamber 201. In this reaction, the $BCl_3$ gas acts so as to break a bond between Si and H (Si—H bond) in the DSB gas. By withdrawing H, the DSB gas having a dangling bond of Si as a result, namely, a substance (active species) in an active state by withdrawing H, is rapidly adsorbed and deposited on the wafer 200. As a result, a layer containing Si and C (SiC layer) is formed on the wafer 200.

As described above, in this embodiment, a temperature condition in the process chamber 201 in steps A and B, is set as a low temperature condition so that DSB is not thermally decomposed or hardly decomposed when the DSB gas alone is supplied into the process chamber 201. Even in such a low temperature region, the SiC layer can be formed, probably owing to the abovementioned action by the $BCl_3$ gas. The $BCl_3$ gas acts like a catalyst to promote a reaction of forming the SiC layer and increase the formation rate, in the lower temperature region in which the formation of the SiC layer is difficult when the DSB gas alone is used. However, the $BCl_3$ gas itself of this embodiment is changed before/after reaction. Namely, the $BCl_3$ gas acts so as to generate a hydrogen compound of halogen or a hydrogen compound of boron by reacting with the DSB gas. Namely, the $BCl_3$ gas acts to generate the hydrogen compound of halogen such as HCl, etc., by making a bond of Cl contained in $BCl_3$ and H contained in DSB. Also, the $BCl_3$ gas acts to generate the hydrogen compound of boron such as $BH_3$ or $B_2H_6$, etc., by making a bond of B contained in $BCl_3$ and H contained in DSB. Accordingly, the $BCl_3$ gas in the reaction system of this embodiment is strictly different from the catalyst, although it has a catalytic action.

An amount of the bond between Si (Si—Si bond) in the SiC layer formed in this embodiment, is smaller than an amount of Si—Si bond in the SiC layer formed without supplying the $BCl_3$ gas into the process chamber 201, namely, in the SiC layer formed by supplying the DSB gas alone into the process chamber 201 and thermally decomposing the DSB gas. Further, the amount of the Si—C bond in the SiC layer formed at this time, is larger than an amount of the Si—C bond in the SiC layer formed without supplying the $BCl_3$ gas into the process chamber 201. Namely, the SiC layer formed at this time, is the layer having a small amount of Si—Si bond, and a large amount of Si—C bond, namely, which is the layer having a small ratio of Si-component (Si concentration), and a large ratio of C-component (C concentration), compared to the SiC layer formed without supplying the $BCl_3$ gas.

One of the factors is considered as follows. By changing the DSB gas to an active substance by the action of the $BCl_3$ gas, adsorption and deposition of this substance on the wafer 200 can be rapidly carried out. Namely, when Si—H bond in the DSB gas is broken by the $BCl_3$ gas, a substance thereby obtained has an active property (property of easily adsorbing and depositing on the wafer), and the adsorption and deposition of this substance on the wafer 200, is rapidly carried out before breaking the Si—C bond or the chain structure of C contained in this substance. As a result, the SiC layer is formed in a state of holding (protecting) the Si—C bond or the chain structure of C in the DSB gas, thus forming a layer having a small amount of Si—Si bond, and a large amount of Si—C bond. Further, the abovementioned reaction is promoted under a low temperature condition of not thermally decomposing DSB when the DSB gas alone is supplied into the process chamber 201, and it can be considered that this is a factor of further increasing the abovementioned effect.

When the SiC layer having a prescribed thickness is formed after elapse of the abovementioned reaction duration, the APC valve 244 is full-opened, to thereby rapidly exhaust the inside of the process chamber 201 (step C). At this time, a process gas unreacted or after contributing to the reaction or a reaction byproduct, remained in the process chamber 201, is exhausted from the process chamber 201 through the exhaust pipe 231, through the communication part 270 on the upper end part 203c of the inner tube 203b, and the cylindrical space 250 between the inner tube 203b and the outer tube 203a. At this time, the valves 243e to 243h are opened, to thereby supply the $N_2$ gas into the process chamber 201. The $N_2$ gas acts as a purge gas, thus further increasing the effect of excluding the process gas unreacted or after contributing to the reaction or the reaction byproduct, from the process chamber 201.

Then, by performing a cycle including the abovementioned steps A to C, namely, the cycle of sequentially performing step A, step B, and step C a prescribed number of times, and preferably multiple numbers (n-times) of times, the SiC film having a prescribed film thickness can be formed on the wafer 200.

When the cycle is performed multiple numbers of times, in each step after at least a second cycle, a description "a prescribed layer is formed on the wafer 200" means that "a prescribed layer is formed on a layer formed on the wafer 200, namely, on an outermost surface of the wafer 200 as a laminate". This point is described above. This point is also applied to a modified example and other embodiment described later.

(Purge and Return to the Atmospheric Pressure)

When the SiC film having a prescribed film thickness is formed, the valves 243e to 243h are opened, to supply the $N_2$ gas into the process chamber 201, and exhaust the $N_2$ gas from the process chamber 201. The $N_2$ gas acts as a purge gas, thus purging the inside of the process chamber 201 by an inert gas, so that the gas remained in the process chamber 201 is removed from the process chamber 201 (purge). Thereafter, the atmosphere in the process chamber 201 is replaced with the inert gas, and the pressure in the process chamber 201 is returned to a normal pressure (return to the atmospheric pressure).

(Boat Unload and Wafer Discharge)

Thereafter, the seal cap 219 is descended by the boat elevator 115, and the lower end of the manifold 209 is opened, and a plurality of processed wafers 200 are unloaded to the outside of the process chamber 201 from the lower end of the manifold 209 in a state of being held by the boat 217 (boat unload). Thereafter, the plurality of processed wafers 200 are discharged from the boat 217 (wafer discharge).

(3) EFFECT

According to this embodiment, the following one or a plurality of effects are exhibited.

(a) In steps A and B, the $BCl_3$ gas is supplied into the process chamber 201 together with the DSB gas, and by confining these gases in the process chamber 201, the film formation processing of the SiC film can be advanced on the wafer 200, in the low temperature region (for example, in the temperature region of 400° C. or less) in which the film formation is difficult when using the DSB gas alone. Namely, by causing the $BCl_3$ gas to exhibit the catalytic action, the film formation temperature of the SiC film using the DSB gas, can be drastically decreased. Further, the film formation in the low temperature region can be realized without using plasma, and therefore plasma damage to the wafer 200 can be prevented, and further, the manufacturing cost of the substrate processing apparatus, namely, a substrate processing cost can be reduced.

(b) In steps A and B, by supplying the $BCl_3$ gas into the process chamber 201 together with the DSB gas, and confining these gases in the process chamber 201, the film formation rate of the SiC film formed on the wafer 200 can be increased compared to the film formation rate in the case of using the DSB gas alone. Namely, in steps A and B, the Si—H bond in the DSB gas is broken by the $BCl_3$ gas, so that the active substance obtained thereby can be rapidly adsorbed and deposited on the wafer 200. The effect of increasing the film formation rate, is generated not only in the low temperature region (for example, 200° C. to 400° C.) in which DSB is not thermally decomposed when the DSB gas alone is supplied into the process chamber 201, but also in the temperature region (for example, 420° C. to 500° C.) in which DSB is thermally decomposed when the DSB gas alone is supplied into the process chamber 201. As a result, even in the low temperature region in which the film formation is difficult when the DSB gas alone is used, the film formation processing of the SiC film can be advanced, and also the film formation rate can be drastically increased in any temperature region.

(c) In steps A and B, by supplying the $BCl_3$ gas into the process chamber 201 together with the DSB gas, and confining these gases in the process chamber 201, the amount of the Si—Si bond in the SiC film can be reduced, and the amount of the Si—C bond in the SiC film can be increased.

Although the $BCl_3$ gas is an inorganic halogenated boron not containing C, namely, the $BCl_3$ gas does not action as a carbon source, as described above, the $BCl_3$ gas acts so as to hold the Si—C bond and the chain structure of C in the DSB gas in steps A and B. Therefore, the SiC film can be formed, in which the ratio of Si-component is small and the ratio of C-component is large, compared to a case of using the DSB gas alone. For example, according to a film formation sequence of this embodiment, an atomic concentration of C in the SiC film can be controlled so that the atomic concentration of C in the SiC film is a concentration (for example concentration of 40% or more) which is hardly realized when the DSB gas alone is used. Thus, a dielectric constant (k value) of the SiC film can be decreased, and an etching resistance can be increased. Such an effect of increasing the atomic concentration of C, is generated not only in the low temperature region (for example, 200° C. to 400° C.) in which DSB is not thermally decomposed when the DSB gas alone is supplied into the process chamber 201, but also in the temperature region (for example, 420° C. to 500° C.) in which DSB is thermally decomposed when the DSB gas alone is supplied into the process chamber 201.

However, by setting the temperature condition in steps A and B, as the temperature condition of not allowing DSB to be thermally decomposed when the DSB gas alone is supplied into the process chamber 201, the amount of Si—Si bond in the SiC film can be further reduced, and the amount of Si—C bond can be further increased. Namely, the ratio of the C-component can be further increased, compared to a case that the DSB gas alone is used.

(d) Thus, according to the film formation sequence of this embodiment, even when a source of a single species is used as an organic-based source confined in the process chamber 201, the film formation temperature of the SiC film formed on the wafer 200 can be decreased, the film formation rate can be increased, and the film property can be changed (C-concentration in the film can be increased). Further, by controlling the supply flow rate of the DSB gas and the $BCl_3$ gas in step A, the reaction duration in step B, and the temperature of the wafer 200 in steps A and B, it would be possible to freely perform fine adjustment of the film formation temperature, the film formation rate, and the film property, etc., of the SiC film.

(e) Owing to the flat-flat configuration of constituting inner surface of the ceiling part of the outer tube 203a to be flat, and the outer surface of the ceiling part of the inner tube 203b to be flat, the volume of the space sandwiched between these ceiling parts is reduced. Thus, the substantial volume of the process chamber 201 can be reduced, and the area in which the active species are generated by the reaction between the DSB gas and the $BCl_3$ gas can be narrowed. As a result, the generation of a variety of active species can be suppressed. Further, by making a large surface area of the space sandwiched between these ceiling parts with respect to the volume, the active species generated in this space can be easily consumed in this space, and the concentration of the active species in this space can be properly reduced. As a result, the concentration distribution of the active species in the process chamber 201, particularly in the wafer arrangement area, can be uniform.

(f) The volume (capacity) of the space sandwiched between the upper end part 203c of the inner tube 203b and the upper end surface 217a of the boat 217 can be reduced. Thus, the generation of a variety of active species can be further suppressed. Further, by making a large surface area of the space sandwiched between the upper end part 203c of the inner tube 203b and the upper end surface 217a of the boat 217 with respect to the volume, the concentration of the active species in this space can be properly reduced. As a result, the concentration distribution of the active species in the process chamber 201, particularly in the wafer arrangement area can be further uniform.

(g) The distance for the active species to reach the wafer 200 is extended, the active species being generated in the space above the upper end surface 217a of the boat 217, or the space between the outer tube 203a and the inner tube 203b. As a result, the active species generated in these parts can be prevented from contact with the wafer 200. Particularly, by providing the communication part 270 in the center part of the inner tube 203b and the upper end part 203c, the distance for the active species to reach the wafer 200 can be extended to maximum, the active species passing through the communication part 270, and the active species can be easily prevented from contact with the wafer 200.

(h) The inner tube 203b is configured so that its side wall part avoids a member constituting the boat 217, and the distance between the inner wall of the side wall part of the inner tube 203b and the edge of the wafer 200 is narrowed to minimum, and the substantial volume of process chamber 201 is further reduced. Thus, the area in which the active species are generated by causing a reaction between the DSB gas and the $BCl_3$ gas, can be further reduced. As a result, the generation of the variety of active species can be further suppressed.

(i) By using the process chamber 201 constituted of the outer tube 203a and the inner tube 203b having the abovementioned configuration, the influence of the active species on the film thickness and the film quality can be suppressed, and the uniform film thickness and film quality in plane and inter-plane of the wafer can be realized. It is confirmed that the abovementioned effect by having the abovementioned configuration of the outer tube 203a and the inner tube 203b, is particularly remarkably exhibited in the film formation process including the step of maintaining the state in which the process gas is confined in the process chamber 201 for a prescribed time, as described in this embodiment.

As a method of reducing the area in which the DSB gas and the $BCl_3$ gas are reacted, the volume of the outer tube 203a may be changed to a required minimum volume, using only the outer tube 203a as the process tube 203, without using the inner tube 203b. Namely, the distance between the outer tube 203a and the boat 217 may be narrowed to required minimum at both parts of the side wall part and the upper end part. The required minimum in this case, is a range in which manufacture of a semiconductor device, substrate processing, and an operation of the substrate processing apparatus, are not impaired. Further, it is also acceptable that a convex portion such as a projection or a rib, etc., or a recess portion such as a groove or a hole, etc., are provided on the inner surfaces of the outer tube 203a and the inner tube 203b, thus forming these inner surfaces in an appearance of having an uneven portion, using a method of reducing the area in which the DSB gas and the $BCl_3$ gas are reacted with each other.

(4) MODIFIED EXAMPLE

The film formation sequence shown in FIG. 4 in step A, shows an example in which supply of the DSB gas and supply of the $BCl_3$ gas into the process chamber 201, are simultaneously started, and thereafter these supplies are simultaneously stopped, namely, an example in which a supply period of the DSB gas and a supply period of the $BCl_3$ gas are matched with each other. However, the film formation sequence of this embodiment is not limited thereto, and may be changed as follows.

Modified Example 1

Figure 5:
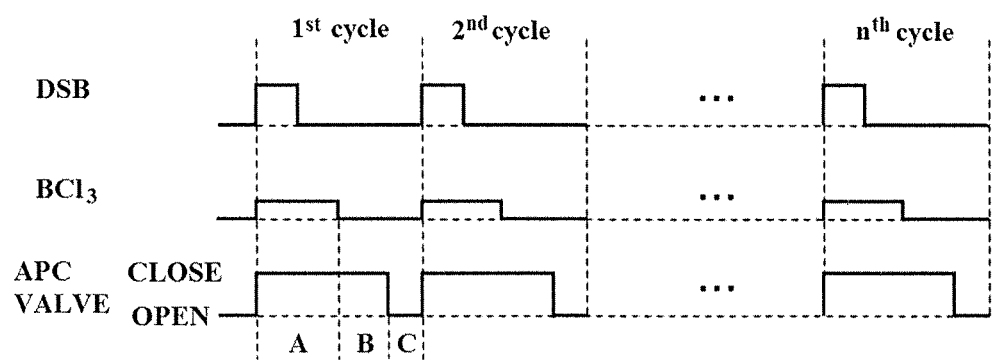
FIG. 5(a) is a view showing a modified example of the film formation sequence according to an embodiment of the present invention.
FIG. 5(b) is a view showing a modified example of the film formation sequence according to an embodiment of the present invention.
Figure 5:
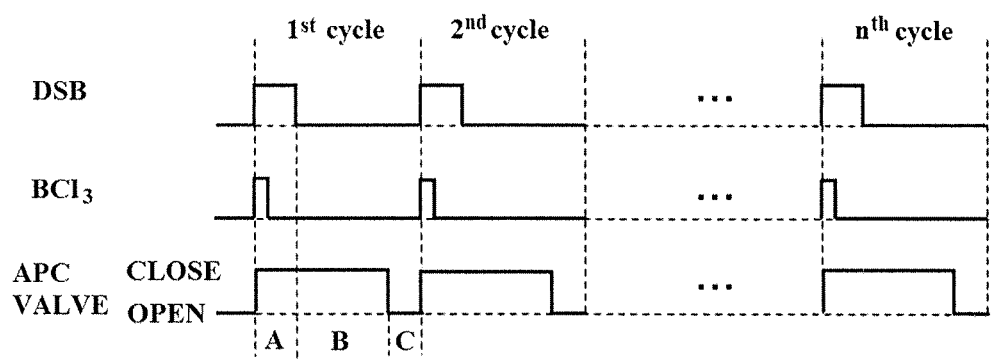

For example, as shown in FIG. 5(a) and FIG. 5(b) in step A, supply of the DSB gas and supply of the BCl₃ gas are simultaneously started, and thereafter supply of one of the DSB gas or the BCl₃ gas may be stopped prior to stop of supply of the other gas. Namely, even after stop of supply of one of the DSB gas or the BCl₃ gas, supply of the other gas may be continued. FIG. 5(a) shows an example of continuing supply of the BCl₃ gas even after stop of supply of the DSB gas. FIG. 5(b) shows an example of continuing supply of the DSB gas even after stop of supply of the BCl₃ gas. Namely, in step A, supply of the DSB gas and supply of the BCl₃ gas are simultaneously started, and these supply times may be different from each other. The processing condition at this time, can be a similar processing condition as the condition of the abovementioned film formation sequence shown in FIG. 4 for example.

In this modified example, it becomes possible to replenish the process gas (DSB gas or BCl₃ gas) consumed by the reaction between the DSB gas and the BCl₃ gas in an initial stage of the step A, and it becomes possible to maintain the abovementioned reaction efficiency utilizing the catalytic action by the BCl₃ gas, namely, possible to suppress the reduction of the reaction efficiency.

Modified Example 2

Figure 6:
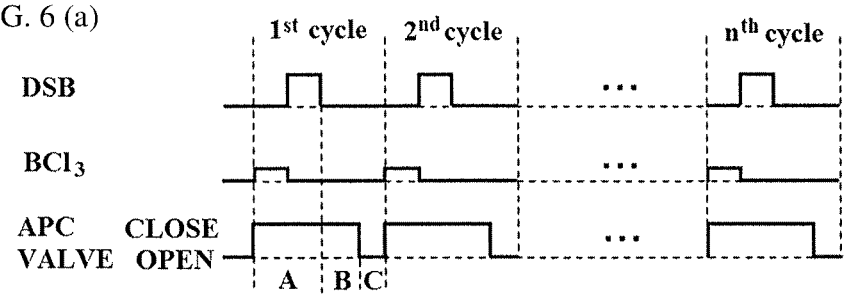
FIG. 6(a) is a view showing a modified example of the film formation sequence according to an embodiment of the present invention.
FIG. 6(b) is a view showing a modified example of the film formation sequence according to an embodiment of the present invention.
FIG. 6(c) is a view showing a modified example of the film formation sequence according to an embodiment of the present invention.
FIG. 6(d) is a view showing a modified example of the film formation sequence according to an embodiment of the present invention.
Figure 6:
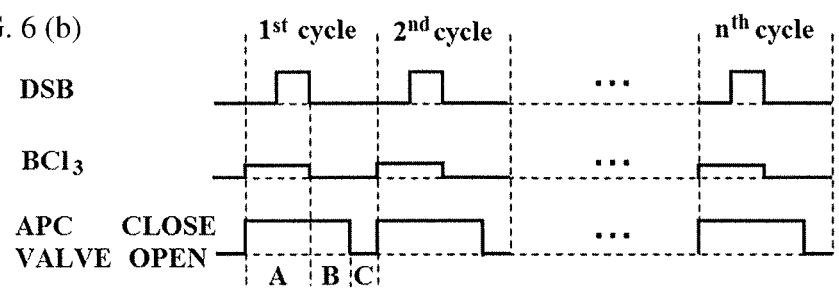
Figure 6:
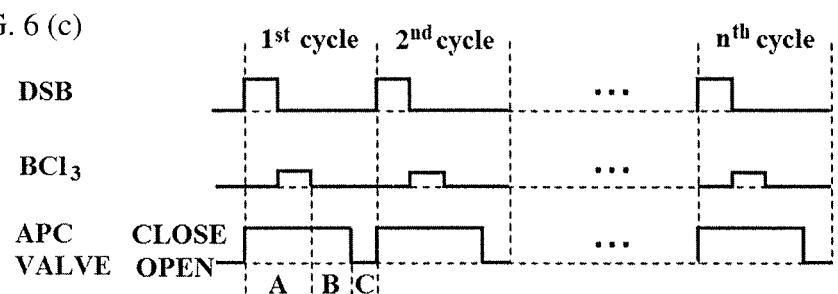
Figure 6:
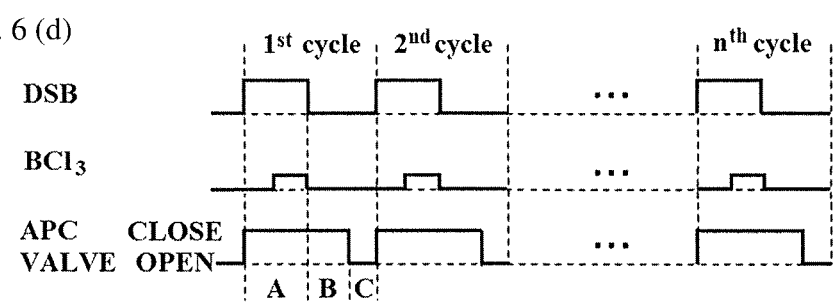

Further, for example, as shown in FIG. 6(a) and FIG. 6(c), in step A, after start and stop of supply of one of the DSB gas or the BCl₃ gas, supply of the other gas may be started. FIG. 6(a) shows an example of starting supply of the DSB gas after stop of supply of the BCl₃ gas. FIG. 6(c) shows an example of starting supply of the BCl₃ gas after stop of supply of the DSB gas. Namely, supply of the DSB gas and the BCl₃ gas may be performed alternately, without overlapping these supply periods. Further, as shown in FIG. 6(b) and FIG. 6(d), it is also acceptable that supply of one of the DSB gas or the BCl₃ gas is started previously, and thereafter supply of the other gas is started while continuing supply of the one of the gases, and thereafter supply of these gases is stopped. FIG. 6(b) shows an example of starting supply of the DSB gas while maintaining supply of the BCl₃ gas, after supply of the BCl₃ gas is started previously. FIG. 6(d) shows an example of starting supply of the BCl₃ gas while maintaining supply of the DSB gas, after supply of the DSB gas is started previously. The processing condition at this time, can be a similar processing condition as the condition of the abovementioned film formation sequence shown in FIG. 4 for example.

In the film formation sequence shown in FIG. 6(a) and FIG. 6(c), in step A, by supplying one of the process gases first into the process chamber 201, a sufficiently diffused state of this process gas in the process chamber 201 (the entire area in the process chamber 201 is set in a state of this process gas atmosphere) is formed first, and in this state, the other gas is supplied into the process chamber 201, and as a result, the abovementioned film formation reaction can be promoted by the reaction between the DSB gas and the BCl₃ gas. As a result, it would be possible to improve the uniformity of wafer inter-plane film thickness of the SiC film, and the wafer in-plane uniformity of the SiC film. In the film formation sequence shown in FIG. 6(b) and FIG. 6(d), a similar effect as the effect of the film formation sequence shown in FIG. 6(a) and FIG. 6(c) can be obtained, and in addition, it becomes possible to replenish the process gas (process gas supplied previously) consumed by the reaction between the DSB gas and the BCl₃ gas, and it becomes also possible to maintain the abovementioned reaction efficiency utilizing the catalytic action by the BCl₃ gas, namely, possible to suppress the reduction of the reaction efficiency.

Modified Example 3

Figure 7:
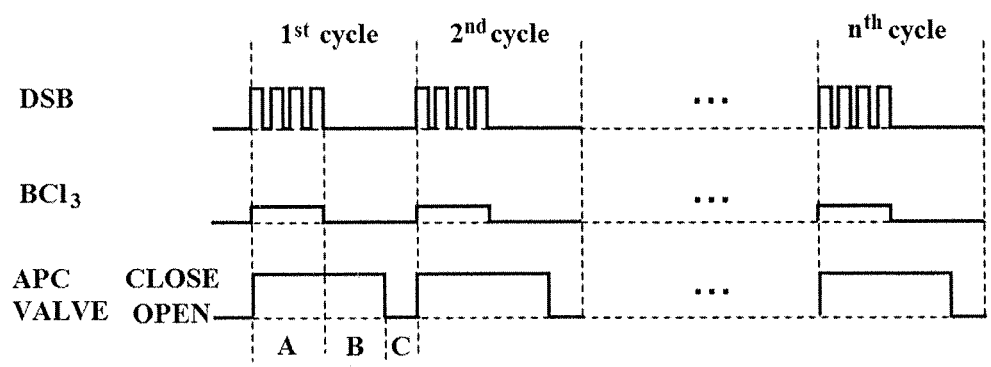
FIG. 7(a) is a view showing a modified example of the film formation sequence according to an embodiment of the present invention.
FIG. 7(b) is a view showing a modified example of the film formation sequence according to an embodiment of the present invention.
Figure 7:
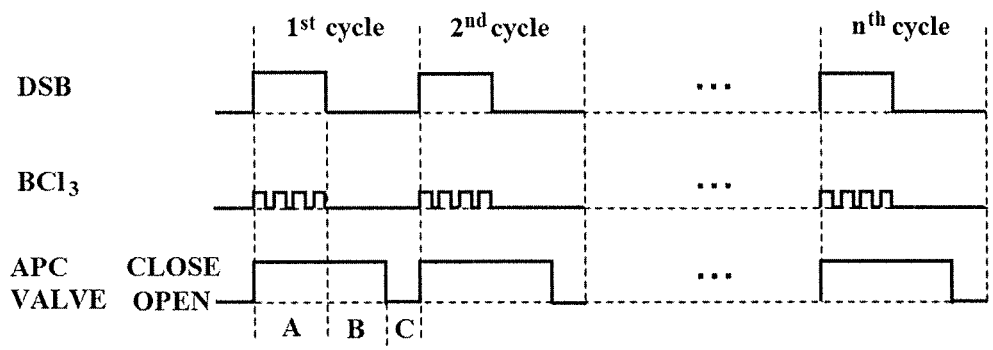

Further, for example, as shown in FIG. 7(a) and FIG. 7(b), in step A, during supply period of one of the DSB gas or the BCl₃ gas, supply of the other gas may be performed intermittently multiple numbers of times. FIG. 7(a) shows an example of performing supply of the DSB gas intermittently during supply period of the BCl₃ gas. FIG. 7(b) shows an example of performing supply of the BCl₃ gas intermittently during supply period of the DSB gas. The processing condition at this time, can be the similar processing condition as the abovementioned film formation sequence shown in FIG. 4 for example.

In this modified example, the pressure in the process chamber 201 during supply period of one of the gases (in step A) is gradually increased in multiple stages (four stages in this case), every time supply of the other gas is intermittently performed multiple numbers of times. When the pressure in the process chamber 201 is low, the uniformity of the wafer in-plane film thickness and step coverage are likely to be improved, although the film formation rate is decreased. When the pressure in the process chamber 201 is high, the film formation rate is likely to be increased, although the uniformity of the wafer in-plane film thickness or the step coverage are decreased. In this modified example, the SiC layer is formed in the case of a high pressure in the process chamber 201, and the SiC layer is formed in the case of a low pressure in the process chamber 201, namely, which is the SiC layer having excellent uniformity of the wafer in-plane thickness and excellent step coverage and used as a base layer of the above SiC layer, and at this time, under an influence of the base layer, the SiC layer having excellent uniformity of the wafer in-plan thickness and excellent step coverage is formed. Namely, in this modified example, an initial layer having excellent uniformity of the wafer in-plane thickness and step coverage can be formed in the initial stage of step A, and thereafter a formation rate of the SiC layer can be gradually increased, while securing the uniformity of the wafer in-plane thickness and step coverage. Thus, both of the improvement of the film formation rate of the SiC film, and the improvement of the uniformity of the wafer in-plane film thickness and step coverage, can be obtained.

Modified Example 4

In the film formation sequence shown in FIG. 4, explanation is given for an example of a cycle of alternately executing the steps A and B once, and thereafter executing step C, namely, a cycle of executing steps A to C in this order prescribed number of times (n-times). However, the film formation sequence of this embodiment is not limited thereto, and the following change may be acceptable.

Figure 8:
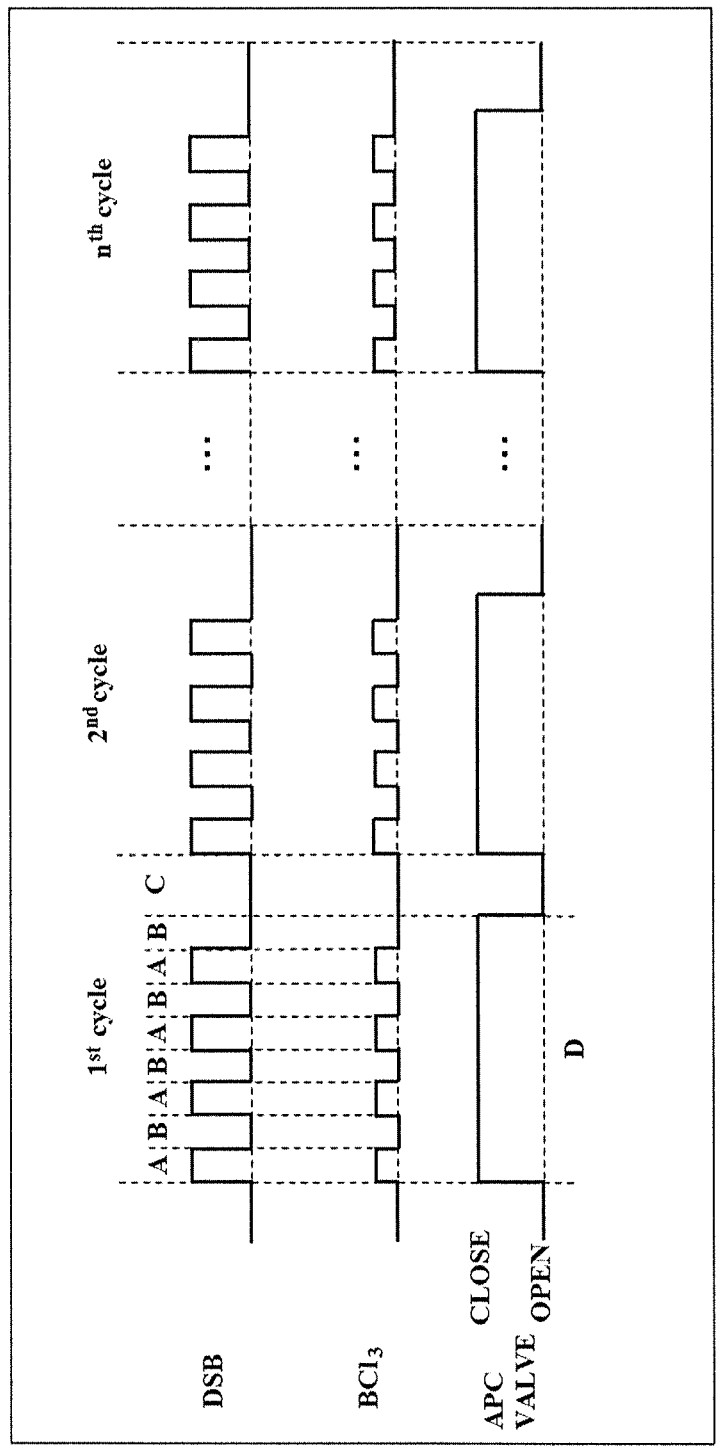
FIG. 8 is a view showing a modified example of the film formation sequence according to an embodiment of the present invention.

For example, as shown in FIG. 8, the cycle of executing step C, after executing the step (step D) of alternately executing the steps A and B multiple numbers of times (for example, four times), may be performed a prescribed number of times (n-times). The processing condition at this time can be the similar processing condition as the abovementioned film formation sequence shown in FIG. 4 for example.

In the film formation sequence shown in FIG. 8, the pressure in the process chamber 201 is gradually increased in multiple stages (four stages in this case), every time the steps A and B are alternately performed multiple number of times. In this case, from the similar reason as modified example 3 shown in FIG. 7, it would be possible to form the initial layer having excellent uniformity of the wafer in-plane thickness and step coverage, and thereafter the formation rate of the SiC layer can be gradually increased, while securing the uniformity of the wafer in-plane thickness and the step coverage. Thus, both of the improvement of the film formation rate of the SiC film, and the improvement of the uniformity of the wafer in-plane film thickness and the step coverage, can be obtained.

Modified Example 5

Further, in the film formation sequence shown in FIG. 4, explanation is given for the example of forming the SiC film on the wafer 200 as SiC-based film. However, the film formation sequence of this embodiment is not limited thereto, and at least one kind of film of SiCN film, SiOC film, and SiOCN film may be formed on the wafer 200 as the SiC-based film.

Figure 9:
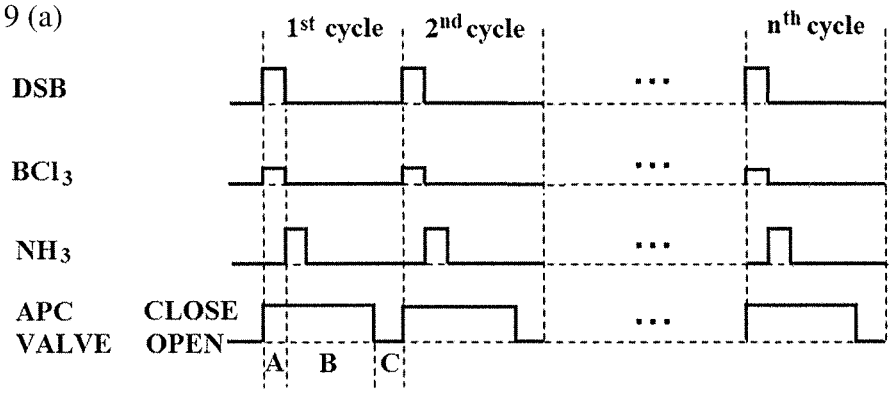
FIG. 9(a) is a view showing a modified example of the film formation sequence according to an embodiment of the present invention.
FIG. 9(b) is a view showing a modified example of the film formation sequence according to an embodiment of the present invention.
FIG. 9(c) is a view showing a modified example of the film formation sequence according to an embodiment of the present invention.
Figure 9:
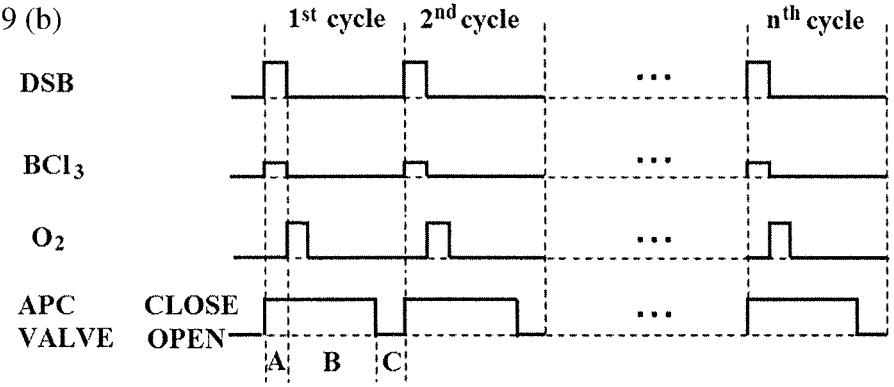
Figure 9:
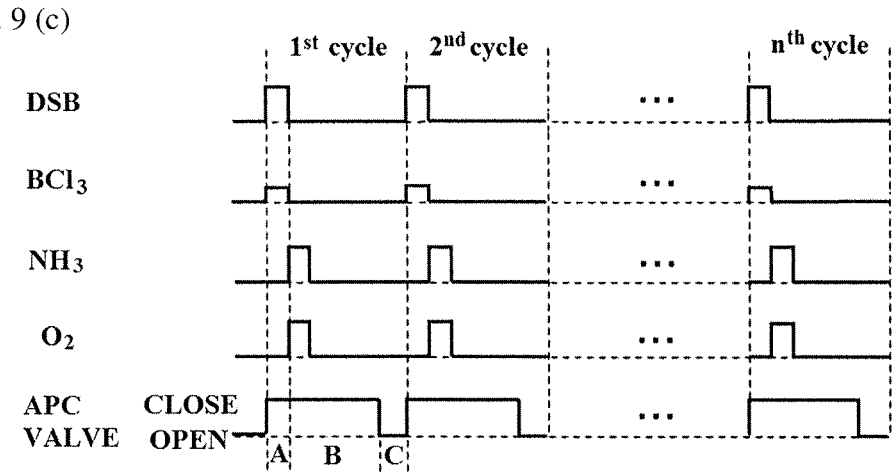

For example, as shown in FIG. 9(a), in step B, etc., by providing the step of supplying $NH_3$ gas for example as a nitriding gas, namely, a nitrogen-containing gas, SiCN film can be formed as the SiC-based film. The nitrogen-containing gas is supplied into the process chamber 201 from the gas supply pipe 232d, through MFC 241d, valve 243d, and nozzle 249d. The supply flow rate of the $NH_3$ gas can be the flow rate in a range of 100 to 1000 sccm for example. The other processing condition can be the similar processing condition as the abovementioned film formation sequence shown in FIG. 4 for example.

Further, for example, as shown in FIG. 9(b), in step B, etc., by providing the step of supplying $O_2$ gas for example as an oxidizing gas, namely, an oxygen-containing gas, SiOC film can be formed as the SiC-based film. The oxygen-containing gas is supplied into the process chamber 201 from the gas supply pipe 232c, through MFC 241c, valve 243c, and nozzle 249c. The supply flow rate of the $O_2$ gas can be the flow rate in a range of 100 to 1000 sccm for example. The other processing condition can be the similar processing condition as the abovementioned film formation sequence shown in FIG. 4 for example.

Further, for example, as shown in FIG. 9(c), in step B, etc., by providing the step of supplying the $NH_3$ gas for example as the nitrogen-containing gas, and the step of supplying the $O_2$ gas for example as the oxygen-containing gas, SiOCN film can be formed as the SiC-based film. In FIG. 9(c), the step of supplying the $NH_3$ gas and the step of supplying the $O_2$ gas are simultaneously performed. However, the step of supplying the $NH_3$ gas may be performed prior to the step of supplying the $O_2$ gas, or the step of supplying the $O_2$ gas may be performed prior to the step of supplying the $NH_3$ gas. The supply flow rate of the $O_2$ gas and the supply flow rate of the $NH_3$ gas can be the flow rate in a range of 100 to 1000 sccm for example. The other processing condition can be the similar processing condition as the abovementioned film formation sequence shown in FIG. 4 for example.

In FIG. 9(a) to FIG. 9(c), in step B, etc., explanation is given for an example of providing the step of supplying the nitrogen-containing gas and/or the step of supplying the oxygen-containing gas during stop of the supply of the DSB gas and the $BCl_3$ gas. The modified example is not limited thereto, and for example, in step A etc., the step of supplying the nitrogen-containing gas and/or the step of supplying the oxygen-containing gas may be provided, while continuing the supply of the DSB gas and the $BCl_3$ gas.

Modified Example 6

As the organic silane-based source, for example, at least one source selected from the group consisting of $SiC_2H_8$, $Si_2CH_8$, $SiC_3H_{10}$, $Si_3CH_{10}$, $SiC_4H_{12}$, $Si_2C_3H_{12}$, $Si_3C_2H_{12}$, $Si_4CH_{12}$, $SiC_2H_6$, $SiC_3H_8$, $Si_2C_2H_8$, $SiC_4H_{10}$, $Si_2C_3H_{10}$, and $Si_3C_2H_{10}$, can be used other than the DSB gas. Namely, as the organic silane-based source, for example, when a carbon element has a single bond, the source expressed by $Si_xC_yH_{2(x+y+1)}$ (x and y in the formula is integer of 1 or more respectively), can be preferably used, and for example, when the carbon element has a double bond, the source expressed by $Si_xC_{(y+1)}H_{2(x+y+1)}$ (x and y in the formula is integer of 1 or more respectively), can be preferably used. It is conceivable that these substances are composed of three elements of Si, C, and H, and containing a bond of Si and C (Si—C bond), a bond of Si and H (Si—H bond), and a bond of C and H (C—H bond) respectively in its chemical structural formula (in the composition formula, in one molecule). Further, these substances are preferably a chain compound containing a chain structure of C in its chemical structural formula, namely, an organic compound having a chain bond of C in its molecule. The organic silane-based source acts as a Si source (silicon source) and a C source (carbon source), when forming the SiC film. These substances act as an electron pair donor capable of providing an unshared electron pair (lone pair) to the pseudo catalysts, namely, act as a Lewis base, when they react with pseudo catalysts in the abovementioned steps A and B.

As the pseudo catalyst, for example, a substance containing at least one selected from the group consisting of a halogen compound and a boron compound such as $BClH_2$, $BCl_2H$, $BOCl_3$, $BF_3$, $BBr_3$, $BI_3$, $B_2H_6$, and $NF_3$, etc., can be used, other than $BCl_3$ gas. These substances can also be a substance containing at least one selected from the group consisting of an inorganic halogen compound and an inorganic boron compound. These substances can also be a substance containing at least one selected from the group consisting of an inorganic halogen compound not containing Si, and an inorganic boron compound not containing Si. Namely, these substances can also be a substance containing at least one of the halogen compound not containing Si and C, the boron compound not containing Si and C, and the halogenated boron not containing Si and C. These substances act as an electron pair acceptor capable of receiving the unshared electron pair from the organic silane-based source, namely, act as a Lewis acid, when reacting with the organic silane-based source in the above steps A and B.

As the nitriding gas, namely, the nitrogen-containing gas, for example, diazene ($N_2H_2$) gas, hydrazine ($N_2H_4$) gas, and $N_3H_8$ gas, etc., can be used. The nitrogen-containing gas acts as N-source (nitrogen source) when the SiCN film and the SiOCN film are formed. The nitrogen ($N_2$) gas is an inert gas, and not captured in the SiC film, and therefore removed from the N source (nitrogen source).

Also, as the nitrogen-containing gas, an amine-based gas can be used. The amine-based gas is the gas containing an amine-group, which is the gas containing at last C, N, and H. The amine-based gas contains amine such as ethylamine, methylamine, propylamine, isopropylamine, butylamine, and isobutylamine, etc. Here, the amine is a generic term of a compound in a form of replacing a hydrogen atom of ammonia ($NH_3$) by a hydrocarbon group such as an alkyl group, etc. Namely, amine contains the hydrocarbon group such as an alkyl group, etc. The amine-based gas can be the gas not containing silicon because it does not contain silicon (Si), and can also be the gas not containing silicon and metal because it does not contain silicon and metal. As the amine-based gas, for example, ethylamine-based gas such as triethylamine (($C_2H_5)_3N$, abbreviation: TEA), diethylamine (($C_2H_5)_2NH$, abbreviation: DEA), and monoethylamine ($C_2H_5NH_2$, abbreviation: MEA), or methylamine-based gas such as trimethylamine, dimethylamine, and monomethylamine, etc., or propylamine-based gas such as tripropylamine (($C_3H_7)_3N$, abbreviation: TPA), dipropylamine (($C_3H_7)_2NH$, abbreviation: DPA), and monopropylamine ($C_3H_7NH_2$, abbreviation: MPA) or isopropylamine-based gas such as triisopropylamine ($[(CH_3)_2CH]_3N$, abbreviation: TIPA), diisopropylamine ($[(CH_3)_2CH]_2NH$, abbreviation: DIPA), and monoisopropylamine (($CH_3)_2CHNH_2$, abbreviation: MIPA), or butylamine-based gas such as tributylamine (($C_4H_9)_3N$, abbreviation: TBA), dibutylamine (($C_4H_9)_2NH$, abbreviation: DBA), and monobutyl amine ($C_4H_9NH_2$, abbreviation: MBA), or isobutyl amine-based gas such as triisobutylamine ($[(CH_3)_2CHCH_2]_3N$, abbreviation: TIBA), diisobutylamine ($[(CH_3)_2CHCH_2]_2NH$, abbreviation: DIBA), monoisobutylamine (($CH_3)_2CHCH_2NH_2$, abbreviation: MIBA), etc., can be preferably used. Namely, as the amine-based gas, for example, at least one kind gas of ($C_2H_5)_xNH_{3-x}$, ($CH_3)_xNH_{3-x}$, ($C_3H_7)_xNH_{3-x}$, $[(CH_3)_2CH]_xNH_{3-x}$, ($C_4H_9)_xNH_{3-x}$, and $[(CH_3)_2CHCH_2]_xNH_{3-x}$ (where, x in the formula is an integer of 1 to 3) can be preferably used. The amine-based gas acts as N source (nitrogen source) and C source (carbon source), when forming the SiCN film and the SiOCN film. By using the amine-based gas as the nitrogen-containing gas, it becomes easy to control in such way that the ratio of the C-component in the SiCN film is increased, and carbon-rich. SiCN film having much C-component can be formed.

As the oxidizing gas, namely, as the oxygen-containing gas, nitrous oxide ($N_2O$) gas, nitric oxide (NO) gas, nitrogen dioxide ($NO_2$) gas, ozone ($O_3$) gas, hydrogen ($H_2$) gas+$O_2$ gas, $H_2$ gas+$O_3$ gas, water vapor ($H_2O$) gas, carbon monoxide (CO) gas, and carbon dioxide ($CO_2$) gas, etc., can be used other than $O_2$ gas. The oxygen-containing gas acts as O-source (oxygen source), when forming the SiOC film and the SiOCN film.

Other Embodiment of the Present Invention

As described above, an embodiment of the present invention has been described. However, the present invention is not limited thereto.

For example, in the abovementioned embodiment, in the step of forming the SiC film, explanation is given for an example of setting the temperature of the wafer 200 to the temperature of not thermally decomposing the DSB gas or the temperature of making it difficult to decompose the DSB gas, when the DSB gas alone is supplied into the process chamber 201. However, the present invention is not limited to the abovementioned embodiment.

Namely, in the step of forming the SiC film (steps A to C), the temperature of the wafer 200 may be set to the temperature of thermally decomposing the DSB gas or the temperature of making it easy to decompose the DSB gas, for example, the temperature in a range of more than 400° C. and 500° C. or less, when the DSB gas alone is supplied into the process chamber 201. In this case as well, similarly to the abovementioned embodiment, the film formation rate of the SiC film can be improved owing to the catalytic action by the $BCl_3$ gas. Further, the $BCl_3$ gas acts so as to break the Si—H bond in the DSB gas, and also acts so as to hold the Si—C bond and the chain structure of C in the DSB gas, and therefore it would be possible to form the SiC film having a small ratio of Si-component and a large ratio of C-component compared to a case of using the DSB gas alone.

Namely, in the present invention, the temperature of the wafer 200 may be set to the temperature of not thermally decomposing the DSB gas or the temperature of making it difficult to decompose the DSB gas, or may be set to the temperature of thermally decomposing the DSB gas or the temperature of making it easy to decompose the DSB gas, when the DSB gas alone is supplied into the process chamber 201. Namely, for example, the temperature of the wafer 200 can be set in a range of 200° C. or more and 500° C. or less, preferably 250° C. or more and 400° C. or less, and more preferably 300° C. or more and 400° C. or less. In the former case, the ratio of the C-component can be further increased, compared to the case of using the DSB gas alone. In the latter case, the film formation rate can be further increased, compared to the case of using the DSB gas alone.

Also, for example, in the abovementioned embodiment, explanation is given for an example of providing the communication part 270 above the portion included in the area horizontally surrounding the wafer arrangement area of the inner tube 203b, specifically, on the upper end part 203c of the inner tube 203b. However, the present invention is not limited to the abovementioned embodiment. Namely, as described above, the communication part 270 may be provided above the wafer arrangement area on the side wall part of the inner tube 203b, and in the vicinity of the upper end part 203c. Further, for example, as shown in FIG. 13, the communication part 270 may be provided below the portion included in the area horizontally surrounding the wafer arrangement area on the side wall part of the inner tube 203b, and at a portion included in the area horizontally surrounding a heat insulation board arrangement area.

When the communication part 270 is provided at the portion included in the area horizontally surrounding the wafer arrangement area of the inner tube 203b, the distance for the active species to reach the wafer 200 becomes short, the active species being generated between the outer tube 203a and the inner tube 203b, and the active species are easily brought into contact with the wafer 200. As a result, the uniformity of the film thickness and film quality of the thin film formed on the wafer 200 are easily reduced in-plane and inter-plane of the wafer. Namely, an in-plane average film thickness of the thin film formed on the wafer 200 close to the communication part 270, becomes easily thicker than the in-plane average film thickness of the thin film formed on the wafer 200 which is away from the communication part 270. Further, in-plane film thickness uniformity of the thin film formed on the wafer 200 close to the communication part 270, is more easily reduced than the in-plane film thickness uniformity of the thin film formed on the wafer 200 which is away from the communication part 270.

Figure 13:
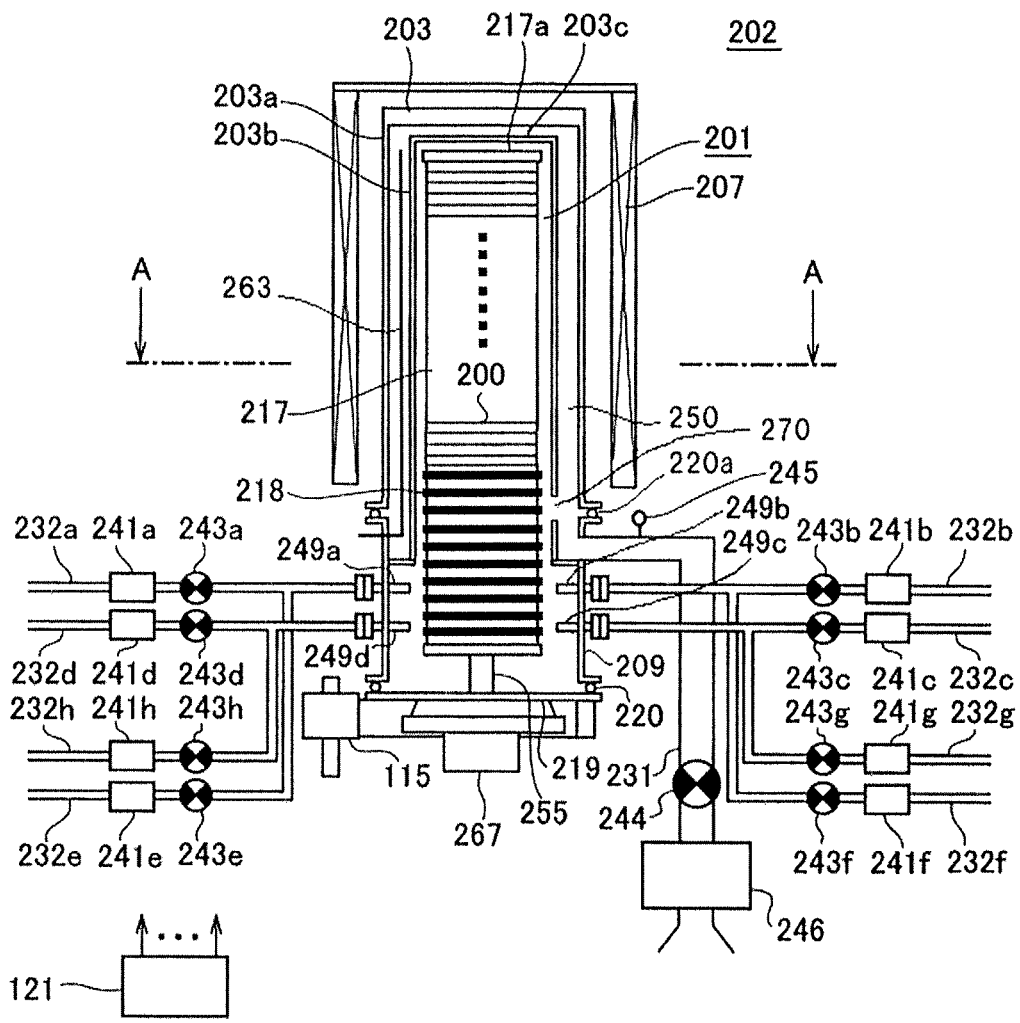
FIG. 13 is a view showing other example of a configuration of an inner tube according to an embodiment of the present invention.

On the other hand, as shown in FIG. 1 and FIG. 13, by providing the communication part 270 above or below the portion included in the area horizontally surrounding the wafer arrangement area of the inner tube 203b, the distance for the active species to reach the wafer 200 can be extended, the active species being generated between the outer tube 203a and the inner tube 203b, and the active species can be prevented from contact with the wafer 200. As a result, the uniformity of the film thickness and the film quality of the thin film formed on the wafer 200 can be improved in-plane and inter-plane of the wafer.

Further, in the abovementioned embodiment, explanation is given for an example of forming the SiC-based film (SiC film, SiCN film, SiOCN film, and SiOC film) containing Si which is a semiconductor element, namely, the silicon carbide-based film. The present invention is not limited to the abovementioned embodiment, and can be applied to a case of forming a metal-based film containing titanium (Ti), zirconium (Zr), hafnium (Hf), tantalum (Ta), aluminum (Al), and molybdenum (Mo), etc., namely, a metal carbide-based film.

For example, the present invention can be suitably applied to a case of forming a metal carbide film such as a titanium carbide film (TiC film), a zirconium carbide film (ZrC film), a hafnium carbide film (HfC film), a tantalum carbide film (TaC film), an aluminum carbide film (AlC film), and a molybdenum carbide film (MoC film), etc.

Further, for example, the present invention can be suitably applied to a case of forming a metal carbonitride film such as a titanium carbonitride film (TiCN film), a zirconium carbonitride film (ZrCN film), a hafnium carbonitride film (HfCN film), a tantalum carbonitride film (TaCN film), an aluminum carbonitride film (AlCN film), and a molybdenum carbonitride film (MoCN film), etc.

Further, for example, the present invention can be suitably applied to a case of forming a metal oxycarbide film such as a titanium oxycarbide film (TiOC film), a zirconium oxycarbide film (ZrOC film), a hafnium acid carbide film (HfOC film), a tantalum oxycarbide film (TaOC film), an aluminum oxycarbide film (AMC film), and a molybdic oxycarbide film (MoOC film), etc.

Further, for example, the present invention is suitably applied to a case of forming a metal oxycarbonitride film such as a titanium oxycarbonitride film (TiOCN film), a zirconium oxycarbonitride film (ZrOCN film), a hafnium oxycarbonitride film (HfOCN film), a tantalum oxycarbonitride film (TaOCN film), an aluminum oxycarbonitride film (AlOCN film), and a molybdenum oxycarbonitride film (MoOCN film), etc.

In this case, a similar sequence as the abovementioned embodiment can be performed, using an organic metal-based source (organic metal-based gas), instead of an organic silane-based source (organic silane-based gas) of the abovementioned embodiment.

For example, when a metal-based thin film containing Ti (TiC film, TiCN film, TiOCN film, and TiOC film) is formed, an organic compound can be used as the organic-based source containing metal elements, the organic compound being composed of three elements of Ti, C, and H, and containing a bond of Ti and C (Ti—C bond), a bond of Ti and H (Ti—H bond), and a bond of C and H (C—H bond) respectively in its chemical structural formula. As the pseudo catalyst, the nitrogen-containing gas, and the oxygen-containing gas, a similar gas as the gas of the abovementioned embodiment can be used. The processing condition at this time can be a similar condition as the condition of the abovementioned embodiment for example.

Further, for example, when a metal-based thin film containing Zr (ZrC film, ZrCN film, ZrOCN film, and ZrOC film) is formed, an organic compound can be used as the organic-based source containing metal elements, the organic compound being composed of three elements of Zr, C, and H, and containing a bond of Zr and C (Zr—C bond), a bond of Zr and H (Zr—H bond), and a bond of C and H (C—H bond) respectively in its chemical structural formula. As the pseudo catalyst, the nitrogen-containing gas, and the oxygen-containing gas, a similar gas as the gas of the abovementioned embodiment can be used. The processing condition at this time can be the similar condition as the condition of the abovementioned embodiment.

Further, for example, when a metal-based thin film containing Hf (HfC film, HfCN film, HfOCN film, and HfOC film) is formed, an organic compound can be used as the organic-based source containing metal elements, the organic compound being composed of three elements of Hf, C, and H, and containing a bond of Hf and C (Hf—C bond), a bond of Hf and H (Hf—H bond), and a bond of C and H (C—H bond) respectively in its chemical structural formula. As the pseudo catalyst, the nitrogen-containing gas, and the oxygen-containing gas, a similar gas as the gas of the abovementioned embodiment can be used. The processing condition at this time can be the similar condition as the condition of the abovementioned embodiment.

Further, for example, when a metal-based thin film containing Ta (TaC film, TaCN film, TaOCN film, and TaOC film) is formed, an organic compound can be used as the organic-based source containing metal elements, the organic compound being composed of three elements of Ta, C, and H, and containing a bond of Ta and C (Ta—C bond), a bond of Ta and H (Ta—H bond), and a bond of C and H (C—H bond) respectively in its chemical structural formula. As the pseudo catalyst, the nitrogen-containing gas, and the oxygen-containing gas, a similar gas as the gas of the abovementioned embodiment can be used. The processing condition at this time can be the similar condition as the condition of the abovementioned embodiment.

Further, for example, when a metal-based thin film containing Al (AlC film, AlCN film, AlOCN film, and AlOC film) is formed, an organic compound can be used as the organic-based source containing metal elements, the organic compound being composed of three elements of Al, C, and H, and containing a bond of Al and C (Al—C bond), a bond of Al and H (Al—H bond), and a bond of C and H (C—H bond) respectively in its chemical structural formula. As the pseudo catalyst, the nitrogen-containing gas, and the oxygen-containing gas, a similar gas as the gas of the abovementioned embodiment can be used. The processing condition at this time can be the similar condition as the condition of the abovementioned embodiment.

Further, for example, when a metal-based thin film containing Mo (MoC film, MoCN film, MoOCN film, and MoOC film) is formed, an organic compound can be used as the organic-based source containing metal elements, the organic compound being composed of three elements of Mo, C, and H, and containing a bond of Mo and C (Mo—C bond), a bond of Mo and H (Mo—H bond), and a bond of C and H (C—H bond) respectively in its chemical structural formula. As the pseudo catalyst, the nitrogen-containing gas, and the oxygen-containing gas, a similar gas as the gas of the abovementioned embodiment can be used. The processing condition at this time can be the similar condition as the condition of the abovementioned embodiment.

Namely, the present invention can be suitably applied to the case of forming the thin film containing a prescribed element such as a semiconductor element or a metal element, etc.

Further, in the abovementioned embodiment, explanation is given for an example of forming the thin film using a batch-type substrate processing apparatus configured to process a plurality of substrates at once. The present invention is not limited to the abovementioned embodiment, and can be suitably applied to a case of forming the thin film using a single-wafer type substrate processing apparatus configured to process one or several substrates at once. In this case as well, the processing condition at this time can be the similar condition as the condition of the abovementioned embodiment for example.

Further, each film formation example and each application example, etc., of the abovementioned embodiment, can be suitably used in combination. The processing condition at this time can be the similar condition as the abovementioned condition of the embodiment.

A process recipe (program in which the processing procedure and the processing condition are recorded) used for the formation of the abovementioned thin film, is preferably prepared individually (a plurality of process recipes are prepared) according to a content of the substrate processing (film type of the formed film, composition ratio, film quality, and film thickness, etc.). Then, when the substrate processing is started, an appropriate process recipe is preferably suitably selected from a plurality of process recipes, according to the content of the substrate processing. Specifically, a plurality of process recipes prepared individually according to the content of the substrate processing, are preferably stored (installed) previously in the memory device $121c$ included in the substrate processing apparatus, via an electric communication line or a recording medium (external memory device 123) storing the process recipes. Then, when the substrate processing is started, the CPU $121a$ included in the substrate processing apparatus, preferably selects the appropriate process recipe according to the content of the substrate processing, from the plurality of process recipes stored in the memory device $121c$. With this configuration, the thin film of various film types, composition ratios, film qualities, and film thicknesses, can be generally formed with good reproducibility by one substrate processing apparatus. Further, an operation load of an operator (load of inputting the processing procedure and the processing condition, etc.) can be reduced, and the substrate processing can be rapidly started while preventing an operation mistake.

The abovementioned process recipe is not limited to a case of newly created, and for example, may be prepared by changing the existing process recipe already installed in the substrate processing apparatus. In the case of changing the process recipe, the process recipe after change may be installed in the substrate processing apparatus via the electric communication line or the recording medium storing the process recipes. Also, the existing process recipe already installed in the substrate processing apparatus may be directly changed, by operating the input/output device 122 included in the existing substrate processing apparatus.

EXAMPLE

Example 1

In this example, SiC film was formed on a plurality of wafers by the film formation sequence shown in the abovementioned. FIG. 4. The kind of the process gas, the processing procedure, and the processing condition were set similarly to those of the abovementioned embodiment. The temperature of the wafer (film formation temperature) at the time of forming the SiC film, was changed in a range of 350° C. to 450° C. Further, as a comparative example, the SiC film was formed on a plurality of wafers by the film formation sequence of performing the film formation shown in FIG. 4 using the DSB gas alone without using the $BCl_3$ gas. The kind of the process gas, the processing procedure, and the processing condition were set similarly to those of the example. The temperature of the wafer was changed in a range of 420° C. to 450° C. Then, the film formation rates of the SiC film of the example and the comparative example were respectively measured.

Figure 10:
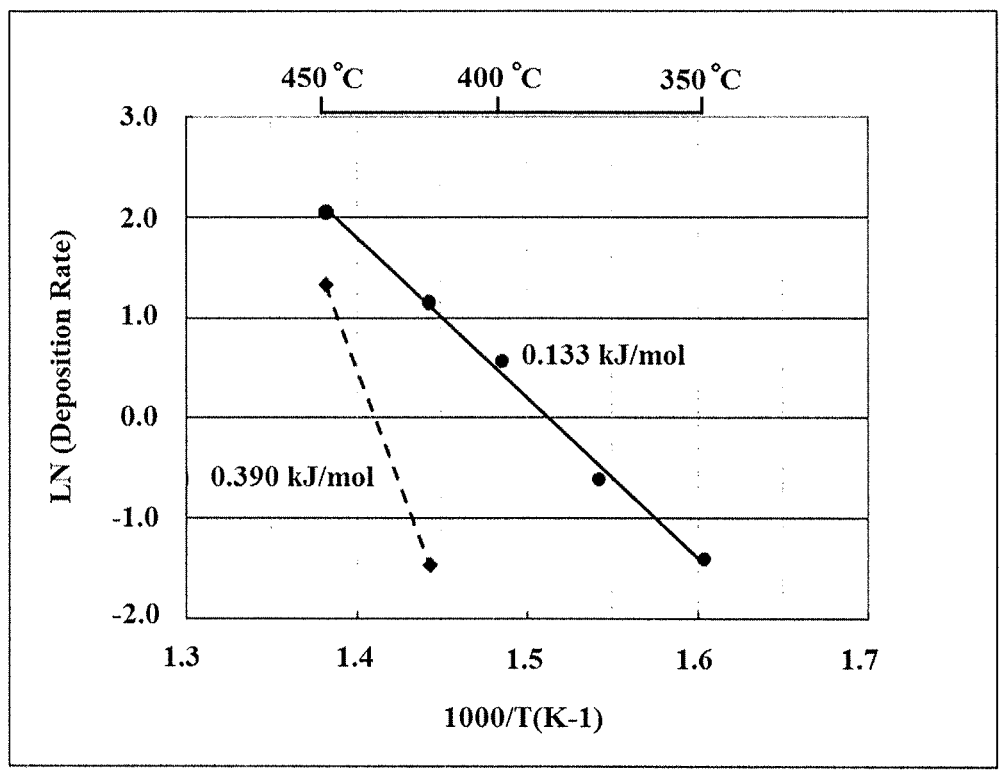
FIG. 10 is a graph showing a film formation rate of SiC film according to an example and a comparative example respectively.

FIG. 10 is a graph (Arrhenius plot) showing the film formation rates of the SiC film of the example and the comparative example. In FIG. 10, the upper horizontal axis indicates a wafer temperature [° C.], and a lower horizontal axis indicates a reciprocal of the wafer temperature [1000/K], and the vertical axis indicates a natural logarithm [a.u.] of the film formation rate respectively. In the figure, the solid line indicates a measurement result of the SiC film of the example, and the broken line indicates a measurement result of the SiC film of the comparative example respectively.

According to FIG. 10, it is found that the film formation rate of the SiC film of the example is larger than the film formation rate of the SiC film of the comparative example, when compared at the same film formation temperature (450° C., 420° C.). It is also found that as the film formation temperature is decreased, the difference between the film formation rate of the SiC film of the example, and the film formation rate of the SiC film of the comparative example is expanded. An activation energy of the SiC film of the example was 0.133 [kJ/mol], and the activation energy of the SiC film of the comparative example was 0.390 [kJ/mol], and it is also found that the activation energy of the SiC film of the example is lower than the activation energy of the SiC film of the comparative example. Thus, in the example, film formation can be performed in a low temperature region compared to the comparative example. Also, in the comparative example, although the SiC film was formed at 450° C., the film formation rate was extremely decreased in the region of less than 420° C. compared to the example, and it is found that the SiC film is hardly formed in the region of 400° C. or less at a practical film formation rate. On the other hand, in the example, the SiC film can be formed in an entire region of the film formation temperature of 450° C. to 350° C., at a practical film formation rate.

Example 2

In this example, SiC film was formed on a plurality of wafers by the film formation sequence shown in FIG. 4. The kind of the process gas, the processing procedure, and the processing condition were set similarly to those of the abovementioned embodiment. The temperature of the wafer (film formation temperature) at the time of forming the SiC film, was changed in a range of 420° C. to 450° C. Further, as a comparative example, the SiC film was formed on a plurality of wafers by the film formation sequence of performing the film formation shown in FIG. 4 using the DSB gas alone without using the $BCl_3$ gas. The kind of the process gas, the processing procedure, and the processing condition were set to be similarly to those of the example. Then, bond states of Si in the SiC films of the example and the comparative example were measured.

Figure 11:
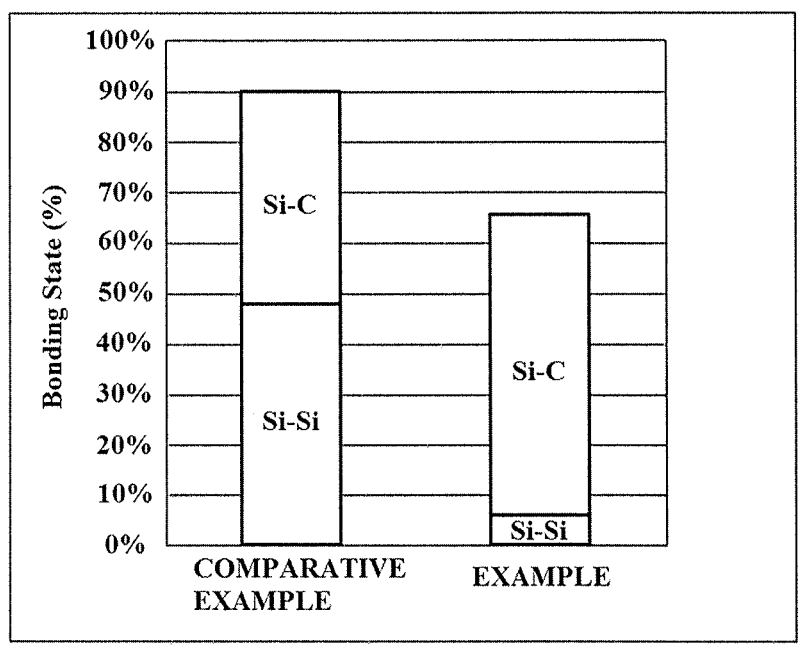
FIG. 11 is a graph showing the ratios of Si—Si bond and Si—C bond contained in the SiC film according to an example and a comparative example respectively.

FIG. 11 is a graph showing the ratio of the Si—Si bond and Si—C bond contained in the SiC films of the examples and the comparative example. In FIG. 11, the horizontal axis indicates the comparative example and the example, and the vertical axis indicates a bond state of Si in the SiC film. FIG. 11 shows the bond state by extracting only Si—Si bond and Si—C bond, and the other bond is omitted for the convenience.

According to FIG. 11, it is found that an amount of the Si—Si bond is smaller and an amount of the Si—C bond is larger in the SiC film of the example, than the SiC film of the comparative example. Probably this is because, in the case of the example, when the SiC film is formed, the $BCl_3$ gas acts so as to break the Si—H bond in the DSB gas, and maintain the Si—C bond and the chain structure of C in the DSB gas. On the other hand, probably this is because, in the case of the comparative example, when the SiC film is formed, the DSB gas is simply thermally decomposed without generating the abovementioned action by the $BCl_3$ gas, and therefore the amount of the Si—C bond is small and the amount of the Si—Si bond is large. Namely, in the comparative example, not only the bond in the DSB gas is broken, but also the Si—C bond and the chain structure of C is broken. Then, it is conceivable that the abovementioned result occurs, due to a large ratio of Si which is separated from C and binds with other Si without re-binding with C, for example.

Example 3

In this example, the SiC film was formed on a plurality of wafers by the film formation sequence shown in FIG. 4. The kind of the process gas, the processing procedure, and the processing condition were set similarly to those of the example. In this example, sample 1 was prepared in which the temperature of the wafer (film formation temperature) at the time of forming the SiC film was set to a temperature (mid-temperature) in a range of 420° C. to 450° C., and sample 2 was prepared in which the temperature of the wafer was set to a temperature (low temperature) in a range of 300° C. to 400° C. Further, as a comparative example, the SiC film was formed on a plurality of wafers by the film formation of performing the film formation sequence shown in FIG. 4 using the DSB gas alone without using the $BCl_3$ gas. The film formation temperature was set to the same as the film formation temperature at the time of preparing sample 1. The kind of the process gas, the processing procedure, and the processing condition were set similarly to those of the example. Then, compositions of the SiC films of the example and the comparative example were measured.

Figure 12:
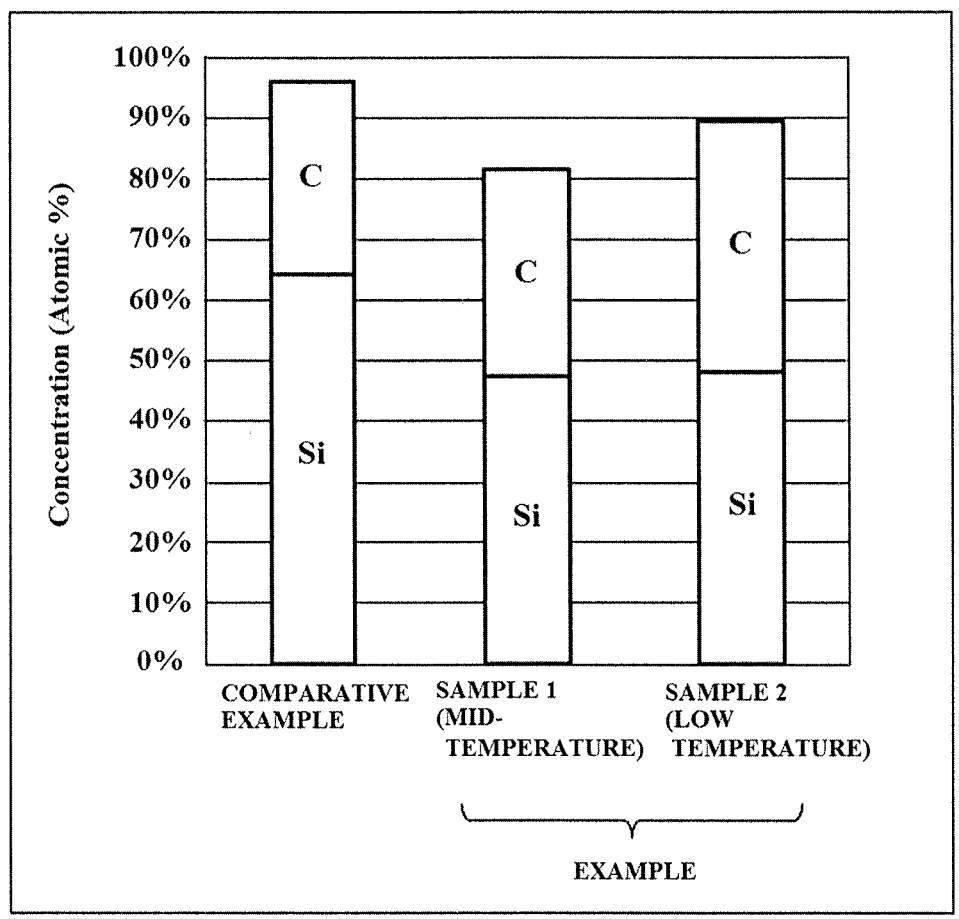
FIG. 12 is a graph showing a composition of the SiC film according to an example and a comparative example respectively.

FIG. 12 is a graph showing the compositions of the SiC films of the example and the comparative example respectively. In FIG. 12, the horizontal axis indicates the comparative example and the example, and the vertical axis indicates the composition of the SiC film, specifically indicates the atomic concentrations of Si and C in the SiC film. In FIG. 12, only the atomic concentrations of Si and C are extracted to be shown, and the atomic concentration of the other element (impurities, etc.) is omitted for the convenience.

According to FIG. 12, it is found that Si concentration is lower (smaller) and C concentration is higher (larger) in the SiC film of the example (samples 1 and 2), than those of the SiC film of the comparative example. Similarly to example 2, probably this is because when the SiC film is formed, the $BCl_3$ gas acts so as to break the Si—H bond in the DSB gas, and also acts so as to maintain the Si—C bond and the chain structure of C in the DSB gas. Further, when the examples are compared with each other, it is found that C-concentration in the SiC film of sample 2 (low temperature) is higher (larger) than the C-concentration in the SiC film of sample 1 (mid-temperature). Probably this is because the wafer temperature in sample 2 is lower than the wafer temperature in sample 1, thus making it easy to suppress the break of the Si—C bond and the chain structure of C. Namely, this is because the Si—C bond and the chain structure of C can be more easily maintained due to the lower temperature in sample 2 than in sample 1.

Preferable aspects of the present invention will be supplementarily described hereafter.

(Supplementary Description 1)

According to an aspect of the present invention, there is provided a method of manufacturing a semiconductor device, including:

forming a film containing a prescribed element and carbon on a substrate by performing a cycle a prescribed number of times, the cycle including:

supplying an organic-based source containing the prescribed element and a pseudo catalyst including at least one selected from the group consisting of a halogen compound and a boron compound, into a process chamber in which the substrate is housed, and confining the organic-based source and the pseudo catalyst in the process chamber;

maintaining a state in which the organic-based source and the pseudo catalyst are confined in the process chamber; and exhausting an inside of the process chamber.

(Supplementary Description 2)

There is provided a method of manufacturing a semiconductor device of the supplementary description 1, wherein the organic-based source contains a bond of the prescribed element and carbon, and a bond of the prescribed element and hydrogen, and the pseudo catalyst acts so as to break the bond of the prescribed element and hydrogen in the organic-based source (so as to extract hydrogen from the organic-based source).

(Supplementary Description 3)

There is provided the method of manufacturing a semiconductor device of the supplementary description 1 or 2, wherein the organic-based source contains a bond of the prescribed element and carbon, and a bond of the prescribed element and hydrogen, and the pseudo catalyst acts so as to break the bond of the prescribed element and hydrogen in the organic-based source, and also acts so as to maintain the bond of the prescribed element and carbon in the organic-based source.

(Supplementary Description 4)

There is provided the method of manufacturing a semiconductor device of any one of the supplementary descriptions 1 to 3, wherein the organic-based source contains a bond of the prescribed element and carbon, and a bond of the prescribed element and hydrogen, and the pseudo catalyst acts so as to break the bond of the prescribed element and hydrogen in the organic-based source, and also acts so as to maintain the bond of the prescribed element and carbon in the organic-based source, to thereby obtain a small amount of the bond of the prescribed elements in the film than an amount of the bond of the prescribed elements with each other in the film formed in a case of not supplying the pseudo catalyst (larger amount of the bond of the prescribed element and carbon in the film than the amount of the bond of the prescribed element and carbon in the film).

(Supplementary Description 5)

There is provided the method of manufacturing a semiconductor device of any one of the supplementary descriptions 1 to 4, wherein the organic-based source contains a bond of the prescribed element and carbon, and a bond of the prescribed element and hydrogen, and the pseudo catalyst acts so as to generate a hydrogen compound of halogen or a hydrogen compound of boron by reacting with the organic-based source.

(Supplementary Description 6)

There is provided the method of manufacturing a semiconductor device of any one of the supplementary descriptions 1 to 5, wherein the organic-based source contains a bond of the prescribed element and carbon, and a bond of the prescribed element and hydrogen, and the pseudo catalyst acts so as to generate a hydrogen compound of halogen or a hydrogen compound of boron, by allowing halogen or boron contained in the pseudo catalyst, to bind with hydrogen contained in the organic-based source.

(Supplementary Description 7)

There is provided the method of manufacturing a semiconductor device of any one of the supplementary descriptions 1 to 6, wherein the organic-based source includes the bond of the prescribed element and carbon, and the bond of the prescribed element and hydrogen.

(Supplementary Description 8)

There is provided the method of manufacturing a semiconductor device of any one of the supplementary descriptions 1 to 7, wherein the organic-based source includes a chain structure (chain skeleton) in its chemical structural formula.

(Supplementary Description 9)

There is provided the method of manufacturing a semiconductor device of any one of the supplementary descriptions 1 to 8, wherein the organic-based source includes at least one selected from the group consisting of $Si_xC_yH_{2(x+y+1)}$ and $Si_xC_{(y+1)}H_{2(x+y+1)}$ (x and y are integers of 1 or more respectively in the formula).

(Supplementary Description 10)

There is provided the method of manufacturing a semiconductor device of any one of the supplementary descriptions 1 to 8, wherein the organic-based source includes at least one selected from the group consisting of $Si_2C_2H_{10}$, $SiC_2H_8$, $Si_2CH_8$, $SiC_3H_{10}$, $Si_3CH_{10}$, $SiC_4H_{12}$, $Si_2C_3H_{12}$, $Si_3C_2H_{12}$, $Si_4CH_{12}$, $SiC_2H_6$, $SiC_3H_8$, $Si_2C_2H_8$, $SiC_4H_{10}$, $Si_2C_3H_{10}$, and $Si_3C_2H_{10}$.

(Supplementary Description 11)

There is provided the method of manufacturing a semiconductor device of any one of the supplementary descriptions 1 to 10, wherein the pseudo catalyst includes at least one selected from the group consisting of an inorganic halogen compound (halogen compound not containing carbon) and an inorganic boron compound (boron compound not containing carbon).

(Supplementary Description 12)

There is provided the method of manufacturing a semiconductor device of any one of the supplementary descriptions 1 to 11, wherein the pseudo catalyst includes at least one selected from the group consisting of the inorganic halogen compound not containing the prescribed element (halogen compound not containing the prescribed element and carbon) and the inorganic boron compound not containing the prescribed element (boron compound not containing the prescribed element and carbon).

(Supplementary Description 13)

There is provided the method of manufacturing a semiconductor device of any one of the supplementary descriptions 1 to 12, wherein the pseudo catalyst includes halogenated boron.

(Supplementary Description 14)

There is provided the method of manufacturing a semiconductor device of any one of the supplementary descriptions 1 to 13, wherein the pseudo catalyst includes at least one selected from the group consisting of $BClH_2$, $BCl_2H$, BOCK, $BCl_3$, $BF_3$, $BBr_3$, $BI_3$, $B_2H_6$, and $NF_3$.

(Supplementary Description 15)

There is provided the method of manufacturing a semiconductor device of any one of the supplementary descriptions 1 to 14, wherein in forming the film containing the prescribed element and carbon, a temperature of the substrate is set to a temperature of not thermally decomposing the organic-based source when the organic-based source alone is supplied into the process chamber.

(Supplementary Description 16)

There is provided the method of manufacturing a semiconductor device of any one of the supplementary descriptions 1 to 14, wherein in forming the film containing the prescribed element and carbon, a temperature of the substrate is set to a temperature of thermally decomposing the organic-based source when the organic-based source alone is supplied into the process chamber.

(Supplementary Description 17)

There is provided the method of manufacturing a semiconductor device of any one of the supplementary descriptions 1 to 16, wherein in forming the film containing the prescribed element and carbon, a temperature of the substrate is set to a temperature of 200° C. or more and 500° C. or less, preferably 250° C. or more and 400° C. or less, and more preferably 300° C. or more and 400° C. or less.

(Supplementary Description 18)

There is provided the method of manufacturing a semiconductor device of any one of the supplementary descriptions 1 to 17, wherein forming the film containing the prescribed element and carbon, is performed under a non-plasma atmosphere.

(Supplementary Description 19)

According to other aspect of the present invention, there is provided a substrate processing method, including:

forming a film containing a prescribed element and carbon on a substrate by performing a cycle a prescribed number of times, the cycle including:

supplying an organic-based source containing the prescribed element, and a pseudo catalyst including at least one selected from a halogen compound and a boron compound into a process chamber in which the substrate is housed, and confining the organic-based source and the pseudo catalyst in the process chamber;

maintaining a state in which the organic-based source and the pseudo catalyst are confined in the process chamber; and exhausting an inside of the process chamber.

(Supplementary Description 20)

According to further other aspect of the present invention, there is provided a substrate processing apparatus, including:

a process chamber in which a substrate is housed;

an organic-based source supply system configured to supply an organic-based source containing a prescribed element into the process chamber;

a pseudo catalyst supply system configured to supply a pseudo catalyst including at least one selected from the group consisting of a halogen compound and a boron compound, into the process chamber;

an exhaust system configured to exhaust an inside of the process chamber; and a control part configured to control the organic-based source supply system, the pseudo catalyst supply system, and the exhaust system, so as to perform a processing of forming a film containing the prescribed element and carbon on the substrate, by performing a cycle a prescribed number of times, the cycle including:

a process of supplying the organic-based source and the pseudo catalyst into the process chamber in which the substrate is housed, and confining the organic-based source and the pseudo catalyst in the process chamber;

a process of maintaining a state in which the organic-based source and the pseudo catalyst are confined in the process chamber; and a process of exhausting the inside of the process chamber. (Supplementary Description 21)

According to further other aspect of the present invention, there are provided a program and a non-transitory computer-readable recording medium storing the program that causes a computer to perform a procedure of forming a film containing a prescribed element and carbon on a substrate by performing a cycle a prescribed number of times, the cycle including:

a procedure of supplying an organic-based source containing the prescribed element, and a pseudo catalyst including at least one selected from the group consisting of a halogen compound and a boron compound, into a process chamber in which the substrate is housed, and confining the organic-based source and the pseudo catalyst in the process chamber;

a procedure of maintaining a state in which the organic-based source and the pseudo catalyst are confined in the process chamber; and a procedure of exhausting an inside of the process chamber.

DESCRIPTION OF SIGNS AND NUMERALS

121 Controller
200 Wafer
201 Process chamber
202 Processing furnace
203 Process tube (processing vessel)
203a Outer tube (Outer reaction tube)
203b Inner tube (Inner reaction tube)
217 Boat (Support)
231 Exhaust pipe
232a to 232h Gas supply pipe

The invention claimed is:

1. A method of manufacturing a semiconductor device, comprising:

forming a film containing a prescribed element which is a semiconductor element or a metal element and carbon on a substrate by performing a cycle a prescribed number of times, the cycle including:

supplying an organic-based source containing a bond of the prescribed element and carbon and a bond of the prescribed element and hydrogen and a pseudo catalyst including at least one selected from the group consisting of a halogen compound and a boron compound, into a process chamber in which the substrate is housed, and mixing and confining the organic-based source and the pseudo catalyst in the process chamber;

maintaining a state in which the organic-based source and the pseudo catalyst are mixed and confined in the process chamber; and exhausting an inside of the process chamber.

2. The method of manufacturing a semiconductor device according to claim 1, wherein the pseudo catalyst acts so as to break the bond of the prescribed element and hydrogen in the organic-based source.

3. The method of manufacturing a semiconductor device according to claim 1, wherein the pseudo catalyst acts so as to break the bond of the prescribed element and hydrogen in the organic-based source, and also acts so as to maintain the bond of the prescribed element and carbon in the organic-based source.

4. The method of manufacturing a semiconductor device according to claim 1, wherein the pseudo catalyst acts so as to generate a hydrogen compound of halogen or a hydrogen compound of boron by reacting with the organic-based source.

5. The method of manufacturing a semiconductor device according to claim 1, wherein the pseudo catalyst acts so as to generate a hydrogen compound of halogen or a hydrogen compound of boron by allowing halogen or boron contained in the pseudo catalyst, to bind with hydrogen contained in the organic-based source.

6. The method of manufacturing a semiconductor device according to claim 1, wherein the organic-based source includes a chain structure in its chemical structural formula.

7. The method of manufacturing a semiconductor device according to claim 1, wherein the pseudo catalyst includes at least one selected from the group consisting of an inorganic halogen compound and an inorganic boron compound.

8. The method of manufacturing a semiconductor device according to claim 1, wherein the pseudo catalyst includes at least one selected from the group consisting of an inorganic halogen compound not containing the prescribed element and an inorganic boron compound not containing the prescribed element.

9. The method of manufacturing a semiconductor device according to claim 1, wherein in forming the film containing the prescribed element and carbon, a temperature of the substrate is set to a temperature of not thermally decomposing the organic-based source when the organic-based source alone is supplied into the process chamber.

10. The method of manufacturing a semiconductor device according to claim 1, wherein in forming the film containing the prescribed element and carbon, a temperature of the substrate is set to a temperature of thermally decomposing the organic-based source when the organic-based source alone is supplied into the process chamber.

11. A substrate processing apparatus, comprising:
a process chamber in which a substrate is housed;
an organic-based source supply system configured to supply an organic-based source containing a bond of the prescribed element which is a semiconductor element or a metal element and carbon and a bond of the prescribed element and hydrogen into the process chamber;
a pseudo catalyst supply system configured to supply a pseudo catalyst including at least one selected from the group consisting of a halogen compound and a boron compound, into the process chamber;
an exhaust system configured to exhaust an inside of the process chamber; and
a control part configured to control the organic-based source supply system, the pseudo catalyst supply system, and the exhaust system, so as to make a processing of forming a film containing the prescribed element and carbon on the substrate perform by performing a cycle a prescribed number of times, the cycle including:
a process of supplying the organic-based source and the pseudo catalyst into the process chamber in which the substrate is housed, and mixing and confining the organic-based source and the pseudo catalyst in the process chamber;
a process of maintaining a state in which the organic-based source and the pseudo catalyst are mixed and confined in the process chamber; and
a process of exhausting the inside of the process chamber.

12. A non-transitory computer-readable recording medium storing a program that causes a computer to perform a procedure of forming a film containing a prescribed element which is a semiconductor element or a metal element and carbon on a substrate by performing a cycle a prescribed number of times, the cycle including:
- a procedure of supplying an organic-based source containing a bond of the prescribed element and carbon and a bond of the prescribed element and hydrogen and a pseudo catalyst including at least one selected from the group consisting of a halogen compound and a boron compound, into the process chamber in which the substrate is housed, and mixing and confining the organic-based source and the pseudo catalyst in the process chamber;
- a procedure of maintaining a state in which the organic-based source and the pseudo catalyst are mixed and confined in the process chamber; and
- a procedure of exhausting an inside of the process chamber.

13. The method of manufacturing a semiconductor device according to claim 1, wherein the organic-based source includes at least one selected from the group consisting of $$Si_xC_yH_{2(x+y+1)} \text{ and } Si_xC_{(y+1)}H_{2(x+y+1)}$$

where
x is an integer of 1 or more, and
y is an integer of 1 or more.

14. The method of manufacturing a semiconductor device according to claim 1, wherein the pseudo catalyst includes at least one selected from the group consisting of $BClH_2$, $BCl_2H$, $BOCl_3$, $BF_3$, $BBr_3$, $BI_3$, $B_2H_6$, and $NF_3$.

* * * * *